United States Patent
Nakamura et al.

(10) Patent No.: US 6,710,683 B2
(45) Date of Patent: Mar. 23, 2004

(54) SURFACE ACOUSTIC WAVE FILTER AND COMMUNICATIONS APPARATUS USING THE SAME

(75) Inventors: Hiroyuki Nakamura, Katano (JP); Toru Yamada, Katano (JP); Kazunori Nishimura, Yawata (JP); Tsutomu Igaki, Amagasaki (JP); Shigeru Tsuzuki, Neyagawa (JP); Ken Matsunami, Kyoto (JP); Toshio Ishizaki, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 80 days.

(21) Appl. No.: 10/114,866

(22) Filed: Apr. 1, 2002

(65) Prior Publication Data

US 2002/0158715 A1 Oct. 31, 2002

(30) Foreign Application Priority Data

Apr. 27, 2001 (JP) ........................................ 2001-131405

(51) Int. Cl.[7] .......................... H03H 9/64; H03H 9/145
(52) U.S. Cl. ..................... 333/193; 310/313 B; 333/154
(58) Field of Search ............................... 333/193–196, 333/150, 154; 310/313 R, 313 B

(56) References Cited

U.S. PATENT DOCUMENTS

| 4,162,465 A | 7/1979 | Hunsinger et al. ........... 333/151 |
| 6,246,150 B1 | 6/2001 | Mitobe .................... 310/313 B |
| 6,469,598 B2 * | 10/2002 | Tsuzuki et al. .............. 333/193 |

FOREIGN PATENT DOCUMENTS

| JP | 54-17647 | * 2/1979 | .................. 333/194 |
| JP | 2000-77973 | 3/2000 | |
| JP | 2000-91869 | 3/2000 | |

OTHER PUBLICATIONS

Hartmann, C.S. et al. "Overview of Design Challenges for Single Phase Unidirectional Saw Filters (Invited)", 1989 Ultrasonics Symposium, IEEE, pp. 79–89 (1989).

H. Nakamura et al., "A New Design Concept for Low–Loss Saw Filters Based on Different–Width Split–Finger SPUDT," Apr., 2001, vol. 49, No. 4, pp. 761–768, *IEEE Microwave Theory and Techniques*.

H. Nakamura et al., "A Practical SPUDT Design for Saw Filters with Different–Width Split–Finger Interdigital Transducers," Oct., 2000, pp. 105–108, *IEEE Ultrasonics Symposium*.

* cited by examiner

Primary Examiner—Barbara Summons
(74) Attorney, Agent, or Firm—RatnerPrestia

(57) ABSTRACT

A surface acoustic wave filter has a piezoelectric substrate and at least two interdigital transducer electrodes on the piezoelectric substrate, wherein at least one of the interdigital transducer electrodes includes a unidirectional electrode and bidirectional electrode, and the length $\lambda d$ of a basic cell of the unidirectional electrode is longer than the length $\lambda s$ of a basic cell of the bidirectional electrode.

16 Claims, 18 Drawing Sheets

[FILTER CHARACTERISTICS WHEN 100 PAIRS OF UNIDIRECTIONAL ELECTRODES AND 200 PAIRS OF BIDIRECTIONAL ELECTRODES ARE USED AS INPUT AND OUTPUT IDT ELECTRODES]
- CENTER FREQUENCY: 200 MHz-BAND
- NORMALIZED FILM THICKNESS: 1.8%
- $L_2/L_1 = 3.0$ $<\lambda_d/\lambda_s = 1.00000 \text{ (CONVENTIONAL)}>$ $<\lambda_d/\lambda_s = 1.00038 \text{ (THIS INVENTION)}>$ Fig. 14
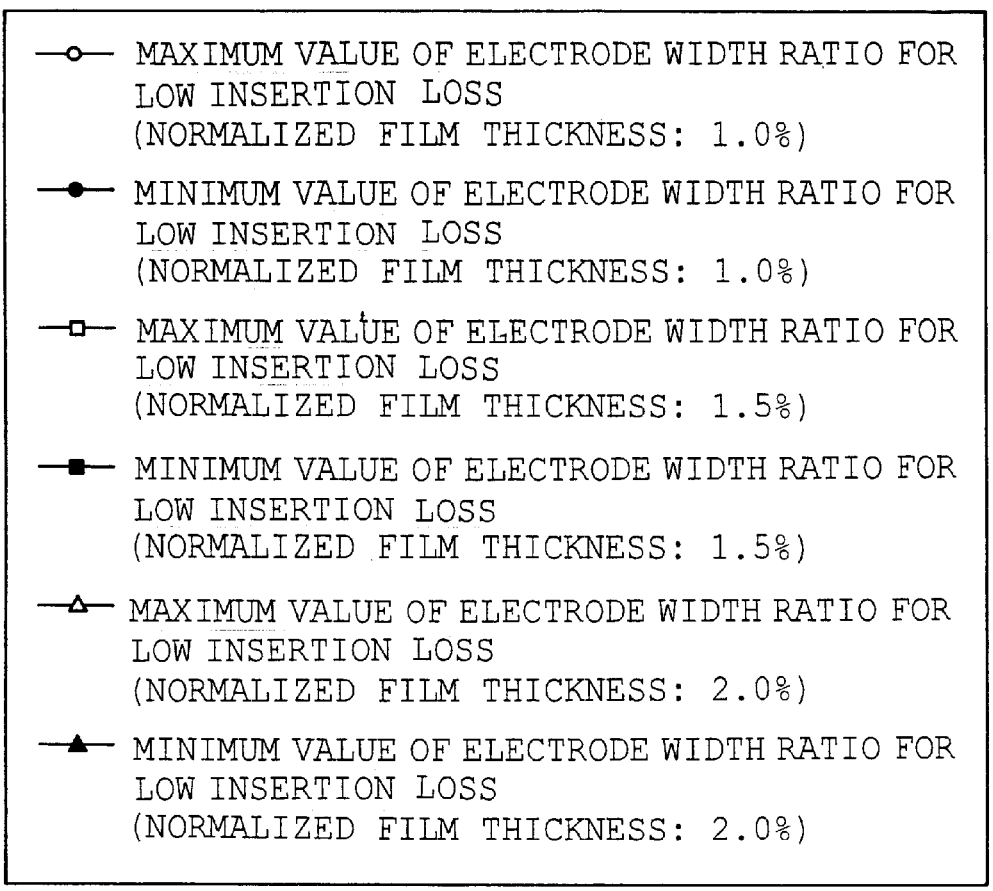
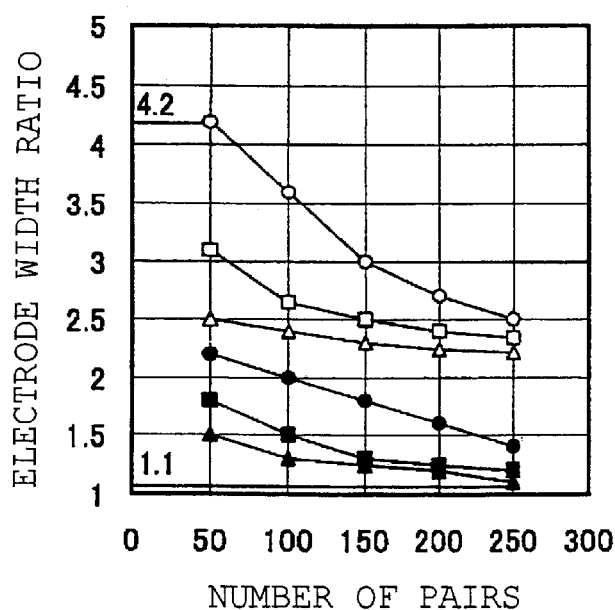

Fig. 15
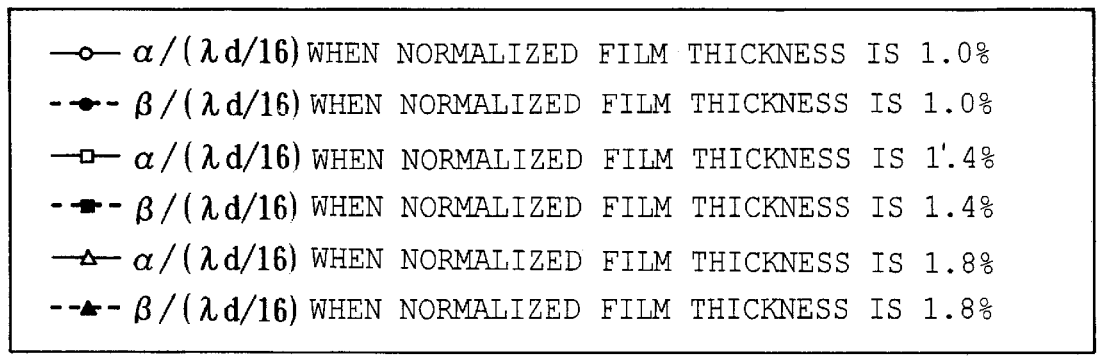
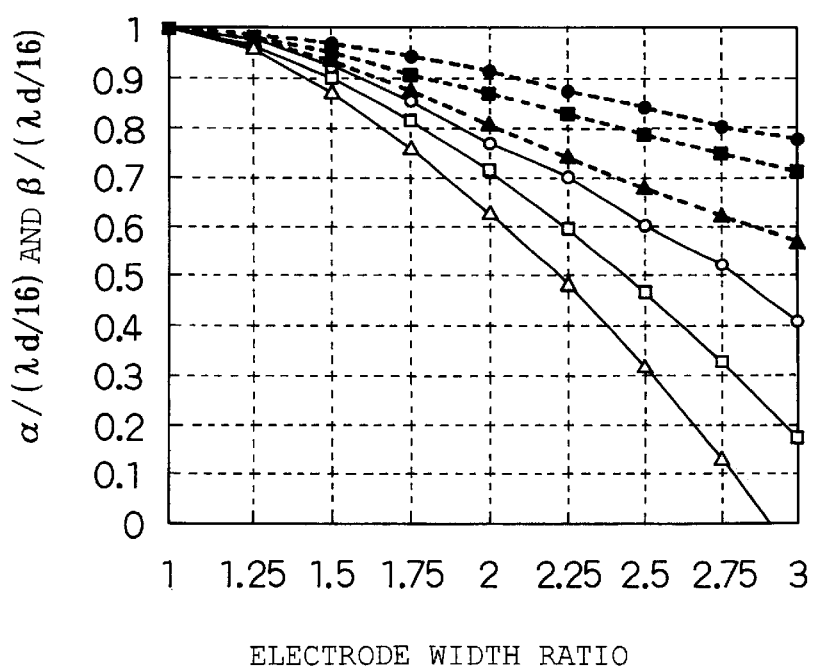

Fig. 22 (A) (PRIOR ART)
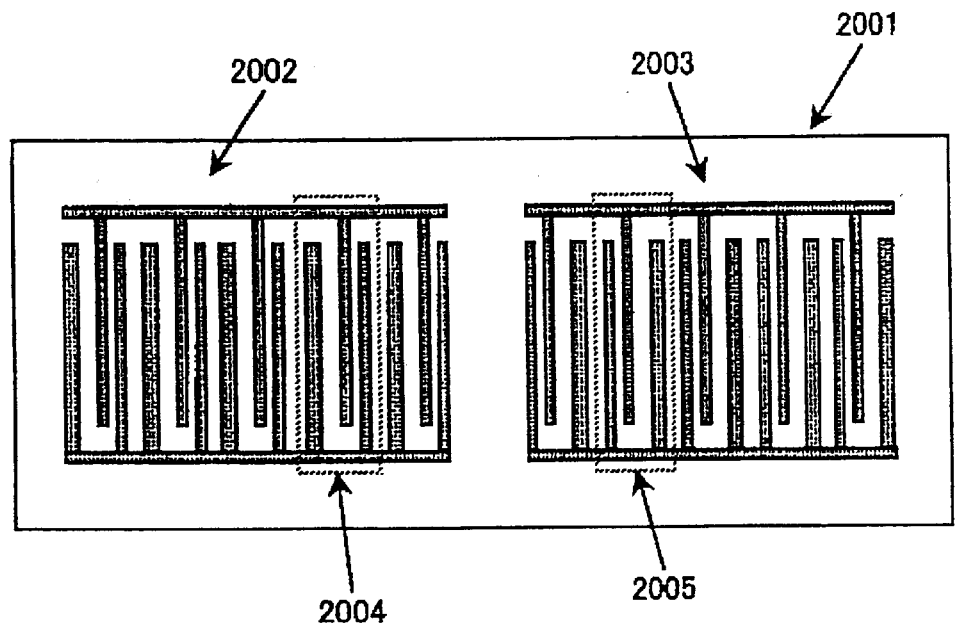
Fig. 22 (B) (PRIOR ART)
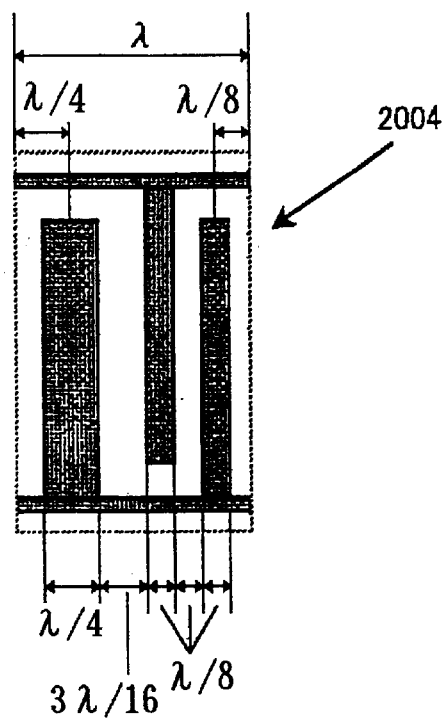

Fig. 23 (A)
(PRIOR ART)
Fig. 23 (B)
(PRIOR ART)
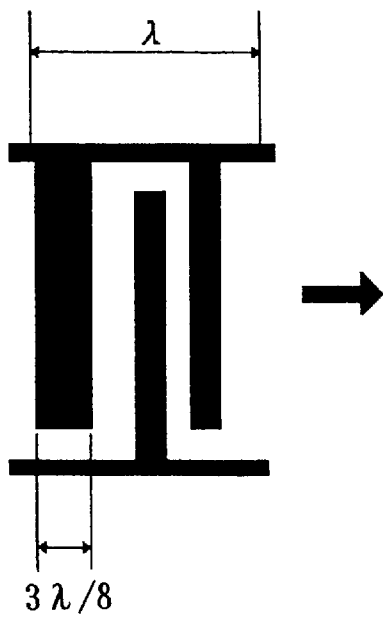
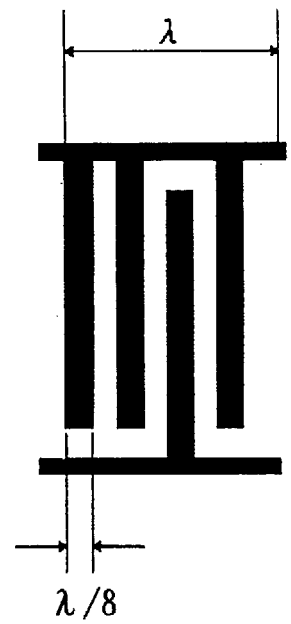

Fig. 24 (A) (PRIOR ART)
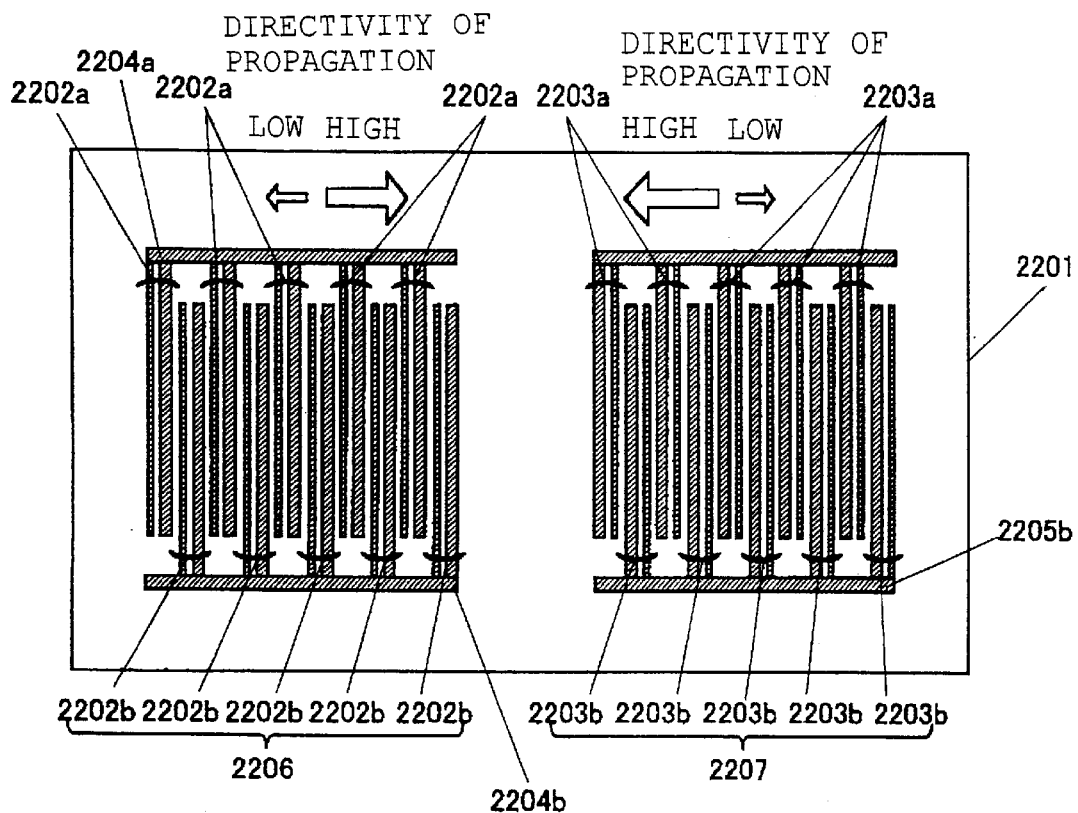
Fig. 24 (B) (PRIOR ART)
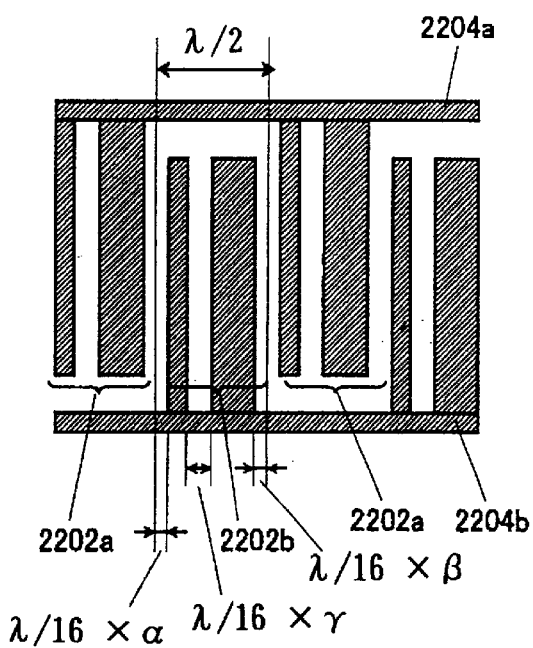

SURFACE ACOUSTIC WAVE FILTER AND COMMUNICATIONS APPARATUS USING THE SAME

BACKGROUND OF THE INVENTION

1. Field of the Invention

The present invention relates to a surface acoustic wave filter and a communications apparatus using the same.

2. Description of the Related Art

Recently, advances in the information and communications fields have led to increases in the amounts of transmitted information. Consequently, there is a demand for a relatively wide-band surface acoustic wave filter which excels in phase linearity within its pass band. A conventional filter which meets this demand is a transversal surface acoustic wave filter. However, as is well known, transversal surface acoustic wave filters have large insertion losses. Thus, as a technology for reducing insertion loss, expectations are placed on, and consideration is given to, transversal surface acoustic wave filters which employ unidirectional electrodes.

Now, conventional transversal surface acoustic wave filters which employ unidirectional electrodes will be described below. FIG. 22A shows a first prior art example of transversal surface acoustic wave filters. Reference numeral 2001 denotes a piezoelectric substrate. A surface acoustic wave filter is constructed by forming input and output interdigital transducer electrodes 2002 and 2003 (hereinafter referred to as IDT electrodes) on the piezoelectric substrate 2001, disposed at a certain distance from each other.

As the input IDT electrode 2002 and output IDT electrode 2003, first and second unidirectional electrodes 2004 and 2005 are used which are based on a prior art technology disclosed in "IEEE Ultrasonics Symposium, 1989, pp. 77–89." This type of unidirectional electrode is known as an EWC-SPUDT (Electrode Width Controlled-Single Phase Unidirectional Transducer).

FIG. 22B shows an enlarged view of the first basic unidirectional-electrode cell 2004. The basic unit consists of three electrode fingers: a $\lambda/4$-wide electrode finger one-fourth as long as the wavelength $\lambda$ of surface acoustic waves propagating on the piezoelectric substrate 2001 and two $\lambda/8$-wide electrode fingers. The second basic unidirectional-electrode cell 2005 is bilaterally symmetrical to the first unidirectional electrode 2004.

In the first and second basic unidirectional-electrode cells 2004 and 2005, the $\lambda/4$-wide electrode fingers function as reflectors. By placing the reflection center of the electrode fingers asymmetrically to the excitation center of surface acoustic waves, it is possible to give directivity to the propagation of the surface acoustic waves. The first basic unidirectional-electrode cell 2004 obtains directivity running from the input IDT electrode 2002 towards the output IDT electrode 2003 while the second basic unidirectional-electrode cell 2005 obtains directivity running from the output IDT electrode 2003 towards the input IDT electrode 2002.

FIG. 23 shows an electrode configuration disclosed in Japanese Published Unexamined Patent Application No. 2000-77973. FIG. 23A shows a basic section of an IDT electrode. It consists of a $3\lambda/8$-wide electrode finger and two $\lambda/8$-wide electrode fingers. It is unidirectional and reflective in the right direction. The basic section here means a part of the IDT electrode which corresponds to one wavelength.

The basic section of an electrode shown in FIG. 23B has excitation effect, but does not produce unidirectional reflections. Thus, it is bidirectional. In either case, the basic section is prescribed by the wavelength $\lambda$. The basic section of an electrode shown in FIG. 23B has excitation effect, but substantially does not reflect waves.

FIG. 24 shows a second prior art example of surface acoustic wave filters using an electrode configuration disclosed in Japanese Published Unexamined Patent Application No. 2000-91869. In FIG. 24A, an input IDT electrode 2206 and output IDT electrode 2207 are mounted on a piezoelectric substrate 2201. The input IDT electrode 2206 consists of interdigitated electrode finger pairs 2202a and 2202b interlocked or engaged with each other in a staggered configuration and extraction electrodes 2204a and 2204b which connects individual pairs 2202a or 2202b while the output IDT electrode 2297 similarly consists of interdigitated electrode finger pairs 2203a and 2203b interlocked or engaged with each other in a staggered configuration and extraction electrodes 2205a and 2205b which connects individual pairs 2203a or 2203b. Each interdigitated electrode finger pair 2202a, 2202b, 2203a, or 2203b consists of two interdigitated electrode fingers of different line widths.

FIG. 24B shows an enlarged view of the input IDT electrode 2206 shown in FIG. 24A. If the spacing between the narrower interdigitated electrode finger and wider interdigitated electrode finger of an interdigitated electrode finger pair 2202b connected to the extraction electrode 2204b is denoted by $\gamma$, $\frac{1}{2}$ the spacing between the narrower interdigitated electrode finger in the interdigitated electrode finger pair 2202b and the wider interdigitated electrode finger in the adjacent interdigitated electrode finger pair 2202a connected to the extraction electrode 2204a is denoted by $\alpha$, and $\frac{1}{2}$ the spacing between the wider interdigitated electrode finger in the interdigitated electrode finger pair 2202b and the narrower interdigitated electrode finger in the adjacent interdigitated electrode finger pair 2202a connected to the extraction electrode 2204a is denoted by $\beta$, then $\gamma > \alpha + \beta$.

With the unidirectional electrode shown in FIG. 24, if the width ratio of the wider interdigitated electrode finger to the narrower interdigitated electrode finger is defined as a line width ratio, the desirable range of the line width ratio from the viewpoint of directivity in relation to insertion loss is said to be no smaller than 3.0 and less than 5.0.

Recently, as portable terminals have become increasingly smaller and more sophisticated, smaller size and higher performance have been required of IF-stage surface acoustic wave filters. However, with the transversal surface acoustic wave filters employing any of the unidirectional electrodes described above, there is a difference in frequency between the region of a unidirectional electrode and the region of a bidirectional electrode, resulting in degradation of both in-band flatness and sharp out-of-band attenuation.

Also, with the transversal surface acoustic wave filter described above, the desirable range of the line width ratio, which is said to be no smaller than 3.0 and no larger than 5.0, is discussed only in terms of unidirectionality in relation to insertion loss, and any optimum electrode configuration which takes other elements into consideration is not suggested. Besides, actual surface acoustic wave filters often employ a combination of unidirectional and bidirectional electrodes, but no optimum electrode configuration is suggested for it either.

On the other hand, regarding the configuration consisting of only unidirectional electrodes, relationships with L2/L1 are not analyzed sufficiently.

SUMMARY OF THE INVENTION

One aspect of the present invention is a surface acoustic wave filter comprising a piezoelectric substrate and at least two interdigital transducer electrodes on the above described piezoelectric substrate, wherein at least one of the above described interdigital transducer electrodes contains a unidirectional electrode and bidirectional electrode, and the length $\lambda d$ of a basic cell of the above described unidirectional electrode is longer than the length $\lambda s$ of a basic cell of the above described bidirectional electrode.

Thanks to the above configuration, the present invention can provide a low-loss surface acoustic wave filter which excels in in-band flatness and attenuation characteristics.

Another aspect of the present invention is the surface acoustic wave filter wherein:

said unidirectional electrode has four electrode fingers in the basic cell prescribed by one wavelength and said four electrode fingers form two electrode finger pairs which are interdigitated with each other; and adjacent electrode fingers in each of said two electrode finger pairs have different electrode widths and the electrode width ratio (L2/L1) of the wider electrode finger (L2) to the narrower electrode finger (L1) is larger than 1.

Still another aspect of the present invention is the surface acoustic wave filter wherein said $\lambda d/\lambda s$ is determined such that the frequency of said unidirectional electrode and frequency of said bidirectional electrode will be substantially equal.

Yet still another aspect of the present invention is the surface acoustic wave filter wherein the film thickness of said unidirectional electrode and film thickness of said bidirectional electrode are substantially equal.

Still yet another aspect of the present invention is the surface acoustic wave filter wherein said bidirectional electrode has electrode fingers of equal width in the basic cell prescribed by one wavelength.

A further aspect of the present invention is the surface acoustic wave filter wherein a phase difference substantially equal to $((45+(n-1)\times 90))$ degrees, when n is a positive number, is provided between the excitation center and reflection center of an electrode finger pair in said unidirectional electrode by making the spacing between the narrower electrode finger and wider electrode finger in the electrode finger pair in said unidirectional electrode larger than the ⅛ wavelength.

A still further aspect of the present invention is the surface acoustic wave filter wherein said electrode finger pair satisfies.

$\gamma > \alpha + \beta$ $\alpha < \beta$ (Formula 4)

where:

$\gamma$ is the distance between the narrower and wider electrode fingers in the electrode finger pair $\alpha$ is the distance between the narrower electrode finger and the left end of the segment obtained by dividing an IDT electrode into half-wavelengths $\beta$ is the distance between the wider electrode finger and the right end of the segment obtained by dividing the IDT electrode into half-wavelengths.

A yet further aspect of the present invention is the surface acoustic wave filter wherein $\alpha$ and $\beta$ in the Formula 4 have been adjusted such that radiation characteristics of one of said interdigital transducer electrodes will be bilaterally symmetrical with respect to the center frequency.

A still yet further aspect of the present invention is the surface acoustic wave filter, wherein:

said unidirectional electrode has four electrode fingers in the basic cell prescribed by one wavelength and said four electrode fingers form two electrode finger pairs which are interdigitated with each other;

adjacent electrode fingers in each of said two electrode finger pairs have different electrode widths and the electrode width ratio (L2/L1) of the wider electrode finger (L2) to the narrower electrode finger (L1) is larger than 1; and the electrode width ratio of the electrode finger pairs in said unidirectional electrode is in the range of $1.1 \leq L2/L1 \leq 4.2$.

An additional aspect of the present invention is the surface acoustic wave filter, wherein the electrode width ratio of the electrode finger pairs in said unidirectional electrode is in the range of $1.1 \leq L2/L1 \leq 2.5$.

A still additional aspect of the present invention is the surface acoustic wave filter, wherein at least one of the interdigital transducer electrodes contains a first unidirectional electrode for amplifying surface acoustic waves in one direction and a second unidirectional electrode for amplifying surface acoustic waves in the opposite direction.

A yet additional aspect of the present invention is the surface acoustic wave filter, wherein said first unidirectional electrode and said second unidirectional electrode are configured by exchanging the positions of the narrower electrode finger and wider electrode finger or by reversing the cell from left to right.

A still yet additional aspect of the present invention is the surface acoustic wave filter, wherein the electrode width ratio (L2/L1) of the electrode finger pairs in said unidirectional electrode is in the range of $1.1 \leq L2/L1 \leq 2.2$.

A supplementary aspect of the present invention is the surface acoustic wave filter, wherein said interdigital transducer electrodes comprise unidirectional electrodes which have multi-directional intensities consisting of two or more electrode width ratios.

A still supplementary aspect of the present invention is the surface acoustic wave filter, wherein said piezoelectric substrate is a 28- to 42-degree rot-Y-cut quartz substrate.

A yet supplementary aspect of the present invention is a communications apparatus containing a surface acoustic wave filter.

BRIEF DESCRIPTION OF THE DRAWINGS

FIG. 14 is a diagram showing relationships between the number of pairs and electrode width ratio in the region where the insertion loss is reduced;

FIG. 15 is a diagram showing relationships of $\alpha/(\lambda d/16)$ and $\beta/(\lambda d/16)$ to the electrode width ratio;

FIG. 22A is a block diagram of a conventional transversal surface acoustic wave filter;

FIG. 22B is an enlarged view of conventional unidirectional electrodes;

FIG. 23A is a block diagram of a basic section of the conventional unidirectional electrode;

FIG. 23B is a block diagram of a basic section of a conventional bidirectional electrode;

FIG. 24A is a block diagram of a conventional surface acoustic wave filter; and

FIG. 24B is an enlarged view of conventional unidirectional electrodes.

DESCRIPTION OF SYMBOLS

Figure 1:
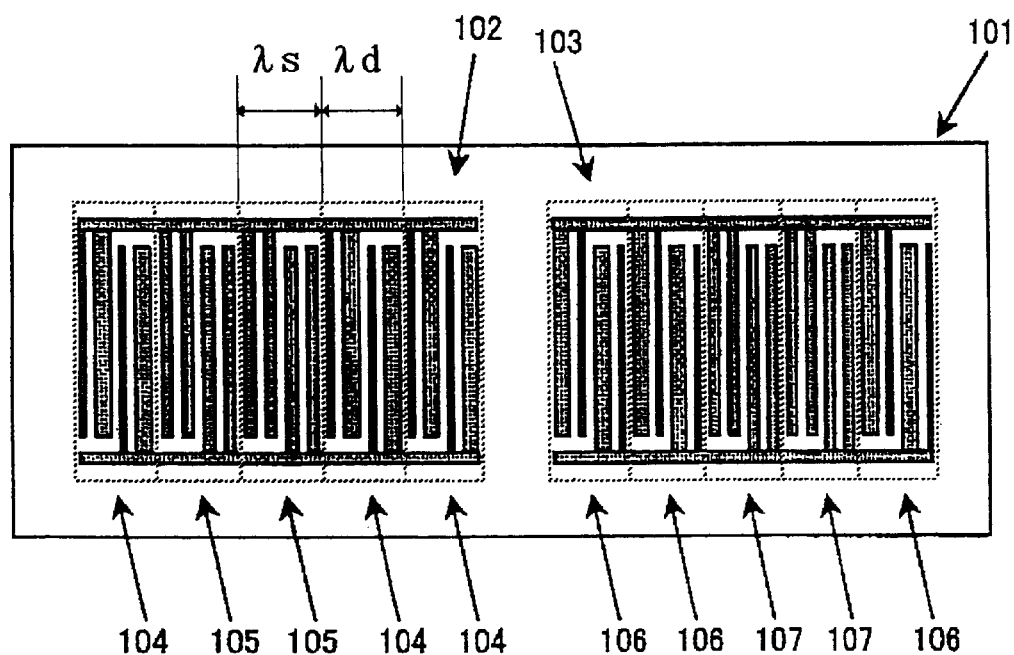
FIG. 1 is a block diagram of a surface acoustic wave filter according to a first embodiment of the present invention.

101, 501, 1601, 2001, 2201 Piezoelectric substrate
102, 502, 1602, 2002, 2206 Input IDT electrode
103, 503, 1603, 2003, 2207 Output IDT electrode
104, 106, 504, 505, 1604, 1605, 2004, 2005 Unidirectional electrode
105, 107 Bidirectional electrode
2202a, 2202b, 2203a, 2203b Interdigitated electrode finger pair
2204a, 2204b, 2205a, 2205b Extraction electrode
201, 202 Electrode finger pair
201a, 201b, 202a, 202b Electrode finger
203, 204 Extraction electrode
205, 206 $\lambda/2$-wide cell

DETAILED DESCRIPTION OF THE PREFERRED EMBODIMENTS

Embodiments of a surface acoustic wave filter according to the present invention will be described below with reference to the accompanying drawings.

(First Embodiment)

FIG. 1 shows a surface acoustic wave filter according to a first embodiment of the present invention. In the figure, reference numeral 101 denotes a piezoelectric substrate. A surface acoustic wave filter is constructed by forming input and output interdigital transducer electrodes 102 and 103 (hereinafter referred to as IDT electrodes) on the piezoelectric substrate 101, disposed at a certain distance from each other. The input IDT electrode 102 includes a unidirectional electrode 104 and bidirectional electrode 105. The length of the basic cell of the unidirectional electrode 104 corresponding to one wavelength is $\lambda d$ while the length of the basic cell of the bidirectional electrode corresponding to one wavelength is $\lambda s$. Also, the output IDT electrode 103 includes a unidirectional electrode 106 and bidirectional electrode 107. The unidirectional electrode 106 has directivity opposite to that of the unidirectional electrode 104, and thus the two electrodes have a bilaterally symmetrical configuration. On the other hand, the bidirectional electrode 107 has the same configuration as the bidirectional electrode 105. With the output IDT electrode 103, again, the length of the basic cell of the unidirectional electrode 106 corresponding to one wavelength is $\lambda d$ while the length of the basic cell of the bidirectional electrode corresponding to one wavelength is $\lambda s$.

FIG. 2A is a schematic view of the unidirectional electrode 104 while FIG. 2B is a schematic layout of the unidirectional electrode 104 and bidirectional electrode 105.

In FIG. 2A, the unidirectional electrode 104 has four fingers in a basic cell. A first electrode finger pair 201 consists of a narrow electrode finger 201a and a wide electrode finger 201b while a second electrode finger pair 202 consists of a narrow electrode finger 202a and a wide electrode finger 202b. The first electrode finger pair 201 is connected to a top extraction electrode 203 and the second electrode finger pair 202 is connected to a bottom extraction electrode 204. The first electrode finger pair 201 and second electrode finger pair 202 are interdigitated with each other. In the unidirectional electrode 104, surface acoustic waves travel from the narrow electrode finger to the wide electrode finger, i.e., they have rightward directivity.

In FIG. 2A, if the electrode finger width of the narrow electrode fingers 201a and 202a is denoted by L1 while the electrode finger width of the wide electrode fingers 201b and 202b is denoted by L2, the electrode width ratio between the narrow electrode and wide electrode of the unidirectional electrode 104 satisfies the relationship L2/L1>1, whose characteristics depend on L2/L1. Furthermore, let γ denote the spacing between the narrow electrode finger 201a and wide electrode finger 201b as well as between the narrow electrode finger 202a and wide electrode finger 202b. Besides, assuming λ/2-wide cells by dividing the basic cell of the unidirectional electrode 104, let α denote the spacing between the narrow electrode finger 201a and the left end of a λ/2-wide cell 205 which contains the first electrode finger pair 201 as well as between the narrow electrode finger 202a and the left end of a λ/2-wide cell 206 which contains the second electrode finger pair 202, and let α denote the spacing between the wide electrode finger 201b and the right end of the λ/2-wide cell 205 which contains the first electrode finger pair 201 as well as between the wide electrode finger 202b and the right end of the λ/2-wide cell 206 which contains the second electrode finger pair 202. Then, γ is larger than α+β and the relationship α<β is satisfied. By satisfying α<β, it is possible to achieve good symmetry, and thus reduce differences within the pass band and increase attenuation outside the pass band.

Next, description will be given about positional relationships in the case in which the unidirectional electrode 104 and bidirectional electrode 105 are placed adjacent to each other. For example, the layout in FIG. 2B illustrates the lengths α, β, and γ in the case where the bidirectional electrodes 105 are placed on both sides of the unidirectional electrode 104. Specifically, thebidirectionalelectrode105 has four λs/8-wide electrode fingers in the basic cell and the center distance of the finger electrodes is λs/4. Thus, the bidirectional electrode 105 is equivalent to the unidirectional electrode 104 where L2=L1=λd/8, α=β=γ/2=λd/16, and λd=λs.

Figure 3:
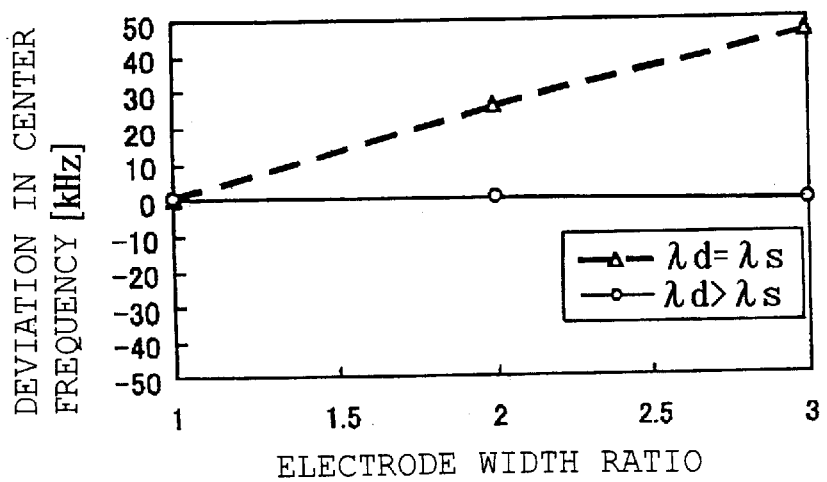
FIG. 3 is a diagram showing relationships between electrode width ratios and frequency differences.

Such a surface acoustic wave filter contains unidirectional and bidirectional electrodes as described above, and it is important to match the surface acoustic waves excited in these electrodes. FIG. 3 shows deviation in the center frequency of a unidirectional electrode from the center frequency of a bidirectional electrode. The horizontal axis represents the electrode width ratio and the vertical axis represents the deviation in the center frequency. In FIG. 3, the number of pairs (basic cells) is 100; L1+L2=λd/4; normalized electrode film thickness (h/λs) is 1.4%; and the center frequency of the bidirectional electrode is 200 MHz. The broken line in FIG. 3 represents the characteristic obtained when λd=λs. As shown by the broken line in FIG. 3, the deviation in the center frequency of the unidirectional electrode from the center frequency of the bidirectional electrode increases with increases in the electrode width ratio.

This is caused by difference in the surface acoustic wave velocity of surface acoustic waves between the unidirectional electrode and bidirectional electrode. This frequency difference can contribute to degradation in characteristics of filters, especially filters which require the sharpest attenuation and in-band flatness. The present invention equalizes the frequencies of the unidirectional electrode and bidirectional electrode by making the unidirectional electrode and bidirectional electrode unequal in the length of the basic cell which corresponds to one wavelength.

The solid line in FIG. 3 represents the deviation in the center frequency when λd>λs. It shows that when L2/L1=2, λd/λs=1.00009 and that when L2/L1=3, λd/λs=1.00023. By satisfying λd>λs as indicated by the solid line in FIG. 3, it is possible to equalize the frequencies of the unidirectional electrode and bidirectional electrode, and thus improve the attenuation characteristics and in-band flatness. Specifically, the deviation in the center frequency can be eliminated by first determining normalized film thickness and L2/L1 of the unidirectional electrode and then determining λd/λs accordingly.

Figure 4:
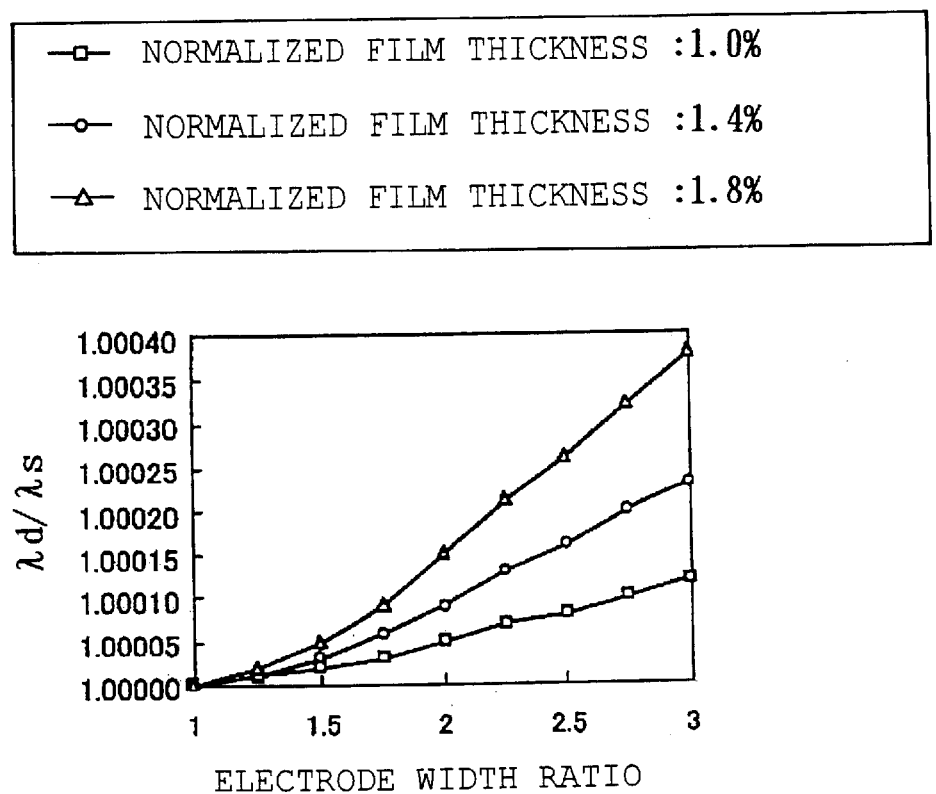
FIG. 4 is a diagram showing relationships between electrode width ratios and $\lambda d/\lambda s$.

FIG. 4 is a graphic representation of relationships between electrode width ratios and λd/λs. Based on FIG. 4, the relationship between electrode width ratios and λd/λs can be approximated as follows:

When the normalized film thickness is 1.0%:

$$\lambda d/\lambda s = 1 \times 10^{-5}(L2/L1)^2 + 2 \times 10^{-5}(L2/L1) + 1 \quad \text{(Formula 1)}$$

When the normalized film thickness is 1.4%:

$$\lambda d/\lambda s = 2 \times 10^{-5}(L2/L1)^2 + 3 \times 10^{-5}(L2/L1) + 1 \quad \text{(Formula 2)}$$

When the normalized film thickness is 1.8%:

$$\lambda d/\lambda s = 4 \times 10^{-5}(L2/L1)^2 + 3 \times 10^{-5}(L2/L1) + 1 \quad \text{(Formula 3)}$$

Thus, with increases in the normalized film thickness, the value of λd/λs increases even for the same electrode width ratio, which proves that it is still more important to adjust the frequencies according to the relationship λd>λs.

Figure 5:
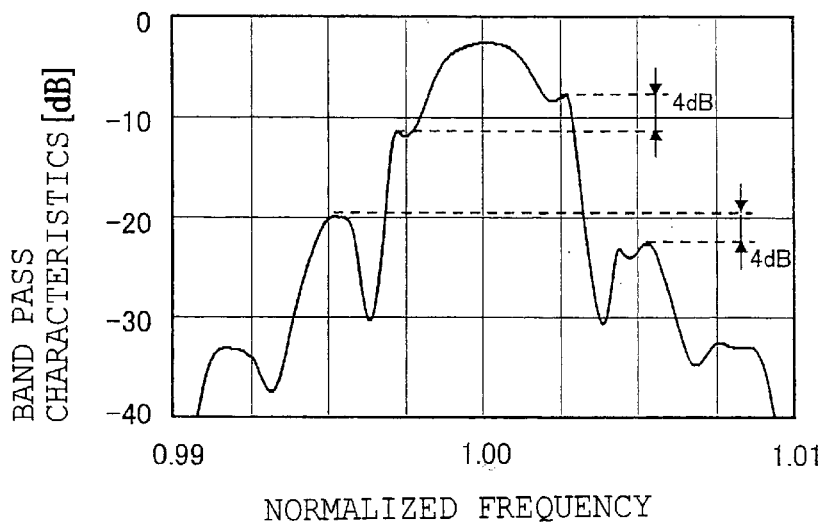
FIG. 5 is a graph showing characteristics of a conventional filter when 100 pairs of unidirectional electrodes and 200 pairs of bidirectional electrodes are used as input and output IDT electrodes.

FIG. 5 shows characteristics of a conventional filter (λd/λs=1.00000) consisting of bidirectional and unidirectional electrodes when the normalized thickness is 1.8%, center frequency is in the 200-MHz band, and L2/L1=3.0.

Figure 6:
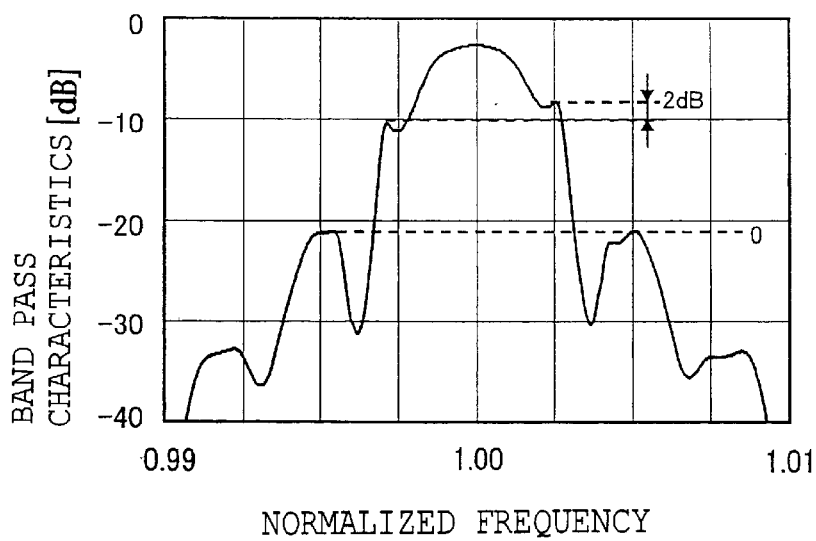
FIG. 6 is a graph showing characteristics of the filter according to the embodiment of the present invention when 100 pairs of unidirectional electrodes and 200 pairs of bidirectional electrodes are used as input and output IDT electrodes.

FIG. 6 shows the characteristics of the filter (λd/λs=1.00038) consisting of bidirectional and unidirectional electrodes according to this embodiment when the normalized thickness is 1.8%, center frequency is in the 200-MHz band, and L2/L1=3.0. This configuration improves flatness within the pass band and symmetry of attenuation characteristics.

(Second Embodiment)

Figure 7:
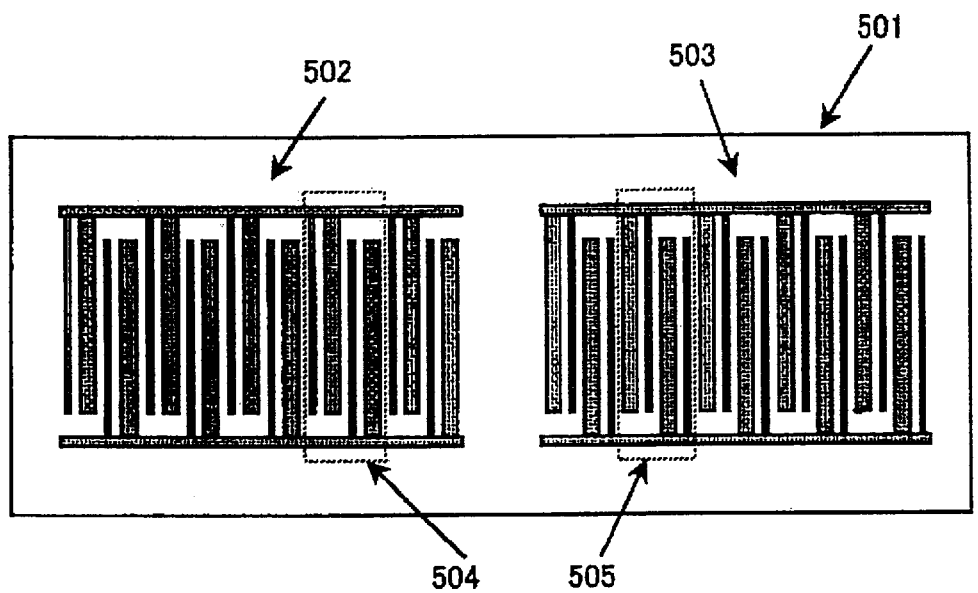
FIG. 7 is a block diagram of a surface acoustic wave filter according to a second embodiment of the present invention.

FIG. 7 shows a surface acoustic wave filter according to a second embodiment of the present invention. In the figure, reference numeral 501 denotes a piezoelectric substrate. A surface acoustic wave filter is constructed by forming input and output interdigital transducer electrodes 502 and 503 (hereinafter referred to as IDT electrodes) on the piezoelectric substrate 501, disposed at a certain distance from each other. The input IDT electrode 502 consists of unidirectional electrodes. Reference numeral 504 denotes a first basic unidirectional-electrode cell. The output IDT electrode 503 consists of unidirectional electrodes. Reference numeral 505 denotes a second basic unidirectional-electrode cell. The first and second basic unidirectional-electrode cells 504 and 505 are based on one wavelength (1λd).

In FIG. 7, the first basic unidirectional-electrode cell 504 has a configuration similar to that of the unidirectional electrode 104 shown in FIG. 2A and has such directivity that surface acoustic waves travel from the narrow electrode finger to the wide electrode finger, i.e., rightward directivity. The second basic unidirectional-electrode cell 505 has a configuration obtained by reversing the positions of the narrow electrodes and wide electrodes in both first and second electrode finger pairs 201 and 202 shown in FIG. 2A and has such directivity that surface acoustic waves travel from the narrow electrode finger to the wide electrode finger, i.e., leftward directivity.

In FIG. 2A, if the electrode finger width of the narrow electrode fingers 201a and 202a is denoted by L1 while the electrode finger width of the wide electrode fingers 201b and 202b is denoted by L2, the characteristics of the unidirectional electrode depend on L2/L1, which is the electrode width ratio between the narrow electrode and wide electrode.

Figure 8:
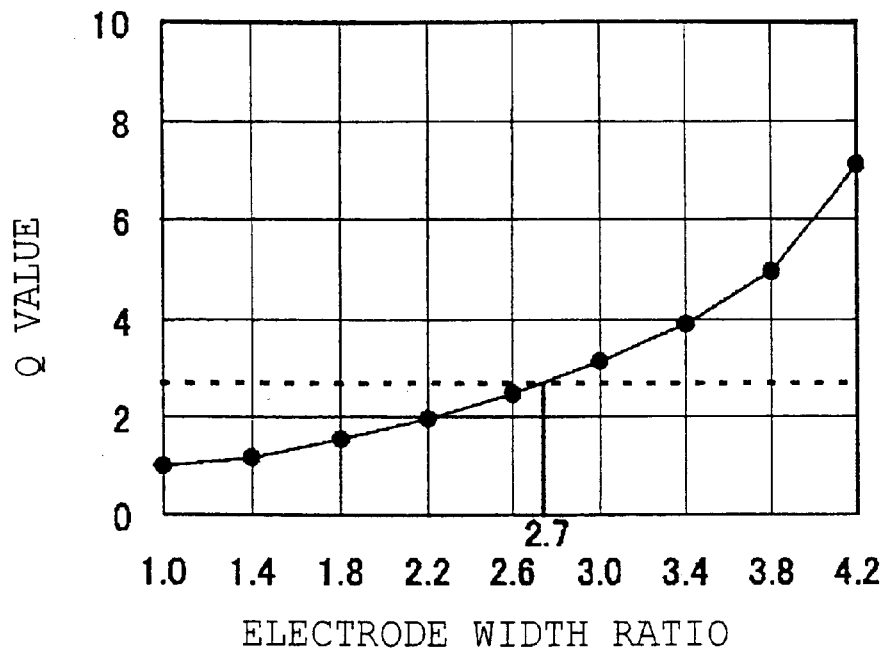
FIG. 8 is a diagram showing Q value vs. electrode width ratio characteristics of the unidirectional electrode.
Figure 9:
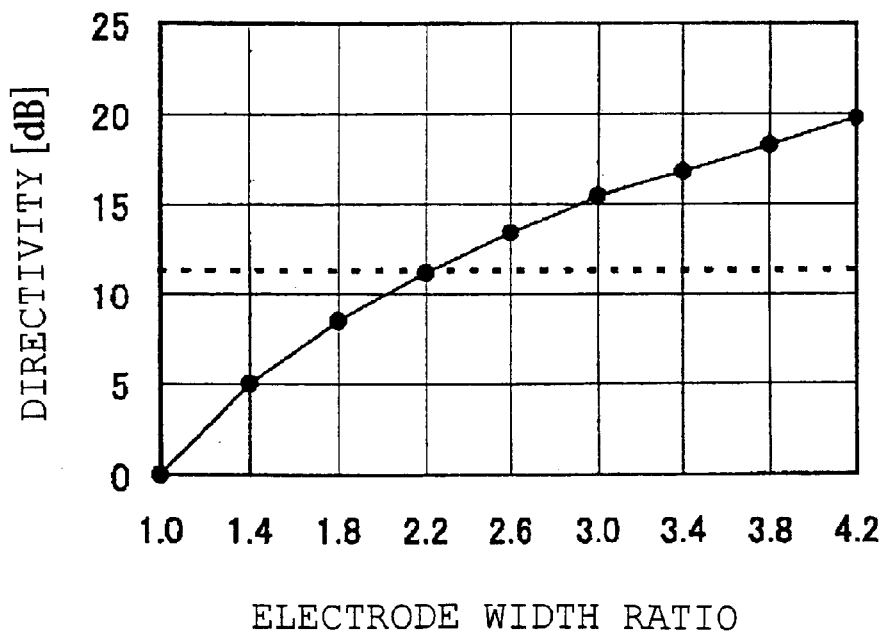
FIG. 9 is a diagram showing directivity vs. electrode width ratio characteristics of the unidirectional electrode.
Figure 10:
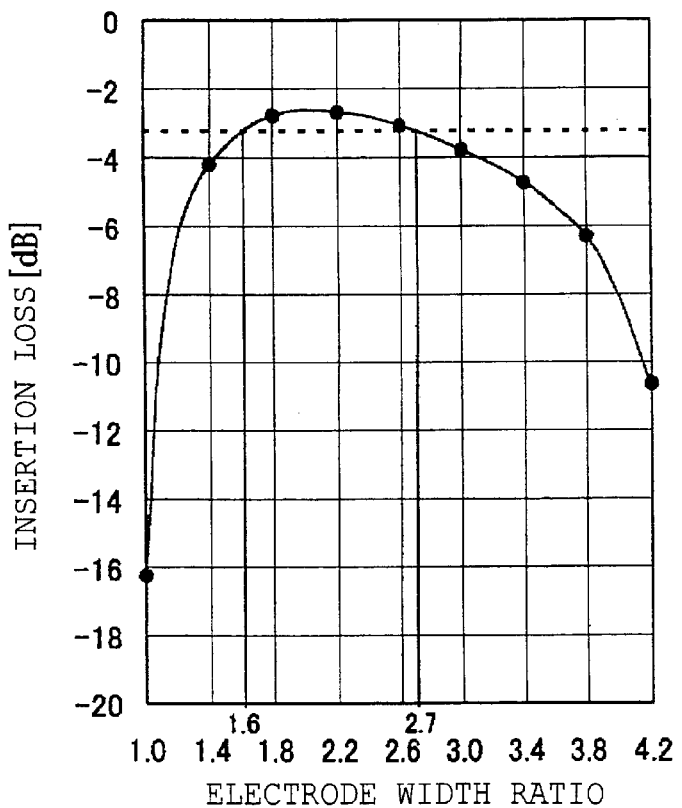
FIG. 10 is a diagram showing insertion loss vs. electrode width ratio characteristics.

FIGS. 8 to 10 show characteristics of the unidirectional electrode with respect to the electrode width ratio. FIG. 8 shows Q value vs. electrode width ratio characteristics of the unidirectional electrode, FIG. 9 shows directivity vs. electrode width ratio characteristics of the unidirectional electrode, and FIG. 10 shows insertion loss vs. electrode width ratio characteristics of the unidirectional electrode. The characteristics shown in FIGS. 8 to 10 were measured under the following conditions: a 37-degree rot-Y-cut quartz substrate was used as the piezoelectric substrate, the number of unidirectional electrode pairs, i.e., the number of basic cells was 200, the normalized film thickness, i.e., the ratio of the wavelength λ to the film thickness was 1%, and L1+L2=λ/4.

In FIG. 8, the Q value is expressed as Q=ωC/G using capacitance C, conductance G, and angular frequency ω. It is inversely proportional to an effective electromechanical coupling factor. Thus, the smaller the Q value, the higher the excitation efficiency of surface acoustic waves. Besides, the Q value in FIG. 8 has been normalized at the Q value of λs/8-wide bidirectional electrodes, which are used conventionally and have an electrode width ratio of L2/L1=1. In FIG. 8, the solid line represents the characteristics of the unidirectional electrode according to the present invention while the broken line represents the characteristics of a conventional EWC-SPUDT (see FIG. 22).

As can be seen from FIG. 8, the excitation efficiency of the unidirectional electrode according to the present invention has been improved over the conventional EWC-SPUDT at L2/L1≦2.7.

Referring to FIG. 9, the term "directivity" means the ratio between the magnitude of the surface acoustic waves propagating in the desired direction and the magnitude of the acoustic waves propagating in the opposite direction. In the figure, the solid line represents the characteristics of the unidirectional electrode according to the present invention and the broken line represents the characteristics of the conventional EWC-SPUDT. As can be seen from the figure, the directivity can be controlled by varying the electrode width ratio and when L2/L1≦2.2, the unidirectional electrode according to the present invention has lower directivity than does the conventional EWC-SPUDT.

The insertion loss of a surface acoustic wave filter is determined by the Q value and directivity which must be traded off against each other. The insertion losses of surface acoustic wave filters shown in FIG. 10 were measured by using unidirectional electrodes for the input and output IDT electrodes, which were placed so that the surface acoustic waves from them would propagate toward each other. In FIG. 10, the solid line represents the characteristics of the unidirectional electrode according to the present invention and the broken line represents the characteristics of the conventional EWC-SPUDT. As can be seen from the figure, the unidirectional electrode according to the present invention has lower insertion loss than the conventional EWC-SPUDT in the range 1.6≦L2/L1≦2.7. It reaches the minimum value, approximately 0.6 dB lower than that of the EWC-SPUDT, when L2/L1 is approximately 2.0.

Figure 11:
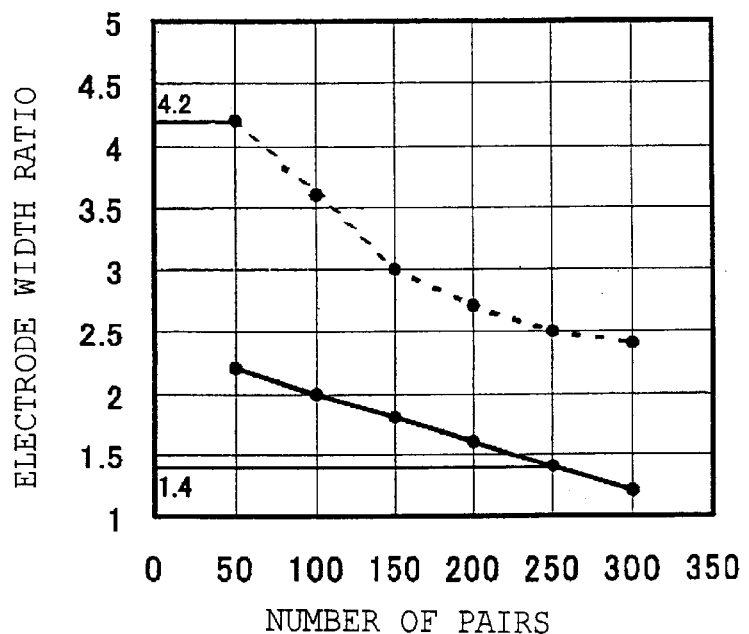
FIG. 11 is a diagram showing dependence of the electrode width ratio on the number of pairs for insertion loss reduction.

The range of the electrode width ratio L2/L1 in which the insertion loss reduction shown in FIG. 10 can be achieved depends on the number of electrode pairs. FIG. 11 shows dependence of the electrode width ratio on the number of pairs for insertion loss reduction. In FIG. 11, the number of pairs means the number of pairs in either the input or output IDT electrode. The solid line represents the minimum values of the electrode width ratio at and above which the insertion loss according to the present invention is lower than that of the EWC-SPUDT while the broken line represents the maximum values of the electrode width ratio at and below which the insertion loss according to the present invention is lower than that of the EWC-SPUDT. Thus, reductions in insertion loss can be achieved if the electrode width ratio is between the solid and broken lines. A surface acoustic wave filter generally consists of approximately 50 to 250 pairs of electrodes although this number varies with the filter size, operating frequency, and weighting function. Thus, as can be seen from FIG. 11, the unidirectional electrode according to the present invention can achieve reductions in insertion loss when the electrode width ratio is in the range of 1.4≦L2/L1≦4.2.

Figure 12:
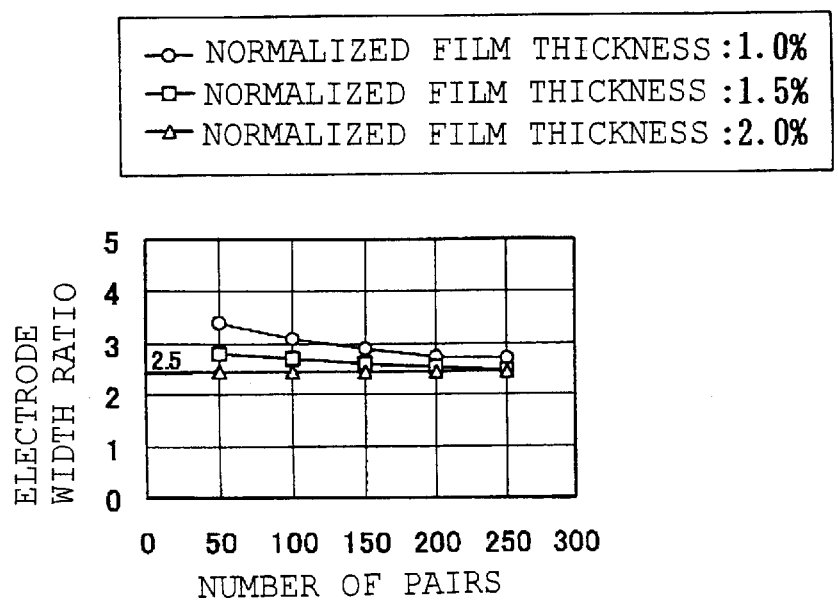
FIG. 12 is a diagram showing relationships between the number of pairs and electrode width ratio in the region where the Q value of the unidirectional electrode is improved.
Figure 13:
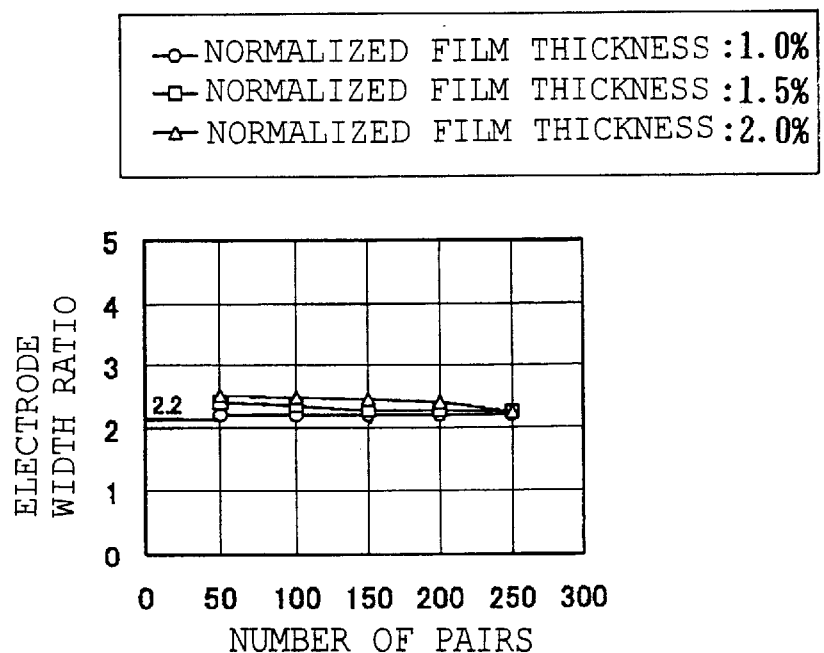
FIG. 13 is a diagram showing relationships between the number of pairs and electrode width ratio in the region where the directivity of the unidirectional electrode is reduced.

FIGS. 12 to 14 show the relationships between the number of pairs and electrode width ratio of unidirectional electrodes when the number of pairs and normalized film thickness are varied. They illustrate how the characteristics of the unidirectional electrode according to the present invention are improved over those of the conventional EWC-SPUDT. FIG. 12 shows the relationship between the number of pairs and electrode width ratio in the region where the Q value of the unidirectional electrode is improved, FIG. 13 shows the relationship between the number of pairs and electrode width ratio in the region where the directivity of the unidirectional electrode is lowered, and FIG. 14 shows the relationship between the number of pairs and electrode width ratio in the region where the insertion loss is reduced. The characteristics shown in FIGS. 9 to 11 were measured under the following conditions: a 37-degree rot-Y-cut quartz substrate was used as the piezoelectric substrate, the number of unidirectional electrode pairs, i.e., the number of basic cells was 50 to 250, the normalized film thickness was approximately 1% to 2%, and L1+L2=λ/4.

FIG. 12 plots the points where the Q value is improved. In the figure, the white circles, white squares, and white triangles represent the normalized film thicknesses of 1%, 1.5%, and 2.0%, respectively. With each normalized film thickness, the Q value of the unidirectional electrode according to the present invention is lower than that of the conventional EWC-SPUDT, and thus the excitation efficiency is improved in the region where the electrode width ratio is below the solid line.

Thus, as can be seen from FIG. 12, under all the conditions of the number of pairs and normalized film thickness, the excitation efficiency of the unidirectional electrode according to the present invention is improved over that of the conventional EWC-SPUDT when the electrode width ratio is L2/L1≦2.5.

FIG. 13 plots the points where the directivity is lowered. In the figure, the white circles, white squares, and white triangles represent the normalized film thicknesses of 1%, 1.5%, and 2.0%, respectively. With each normalized film thickness, the directivity of the unidirectional electrode according to the present invention is lower than that of the conventional EWC-SPUDT in the region where the electrode width ratio is below the solid line. As can be seen from FIG. 13, under all the conditions of the number of pairs and normalized film thickness, the directivity of the unidirectional electrode according to the present invention is lower than that of the conventional EWC-SPUDT when the electrode width ratio is L2/L1≦2.2.

The insertion loss of a surface acoustic wave filter is determined by the Q value and directivity which must be traded off against each other. The insertion losses of surface acoustic wave filters shown in FIG. 14 were measured by using unidirectional electrodes for the input and output IDT electrodes, which were placed so that the surface acoustic waves from them would propagate toward each other. FIG.

14 shows the maximum and minimum values in the electrode width ratio ranges within which the insertion loss is lower than that of the EWC-SPUDT, with the white marks representing the maximum values and the black marks representing the minimum values and the circles, squares, and triangles representing the normalized film thicknesses of 1%, 1.5%, and 2.0%, respectively. Thus, reductions in insertion loss can be achieved if the electrode width ratio is between the respective maximum and minimum values.

As can be seen from FIG. 14, the unidirectional electrode according to the present invention can achieve reductions in insertion loss when the electrode width ratio is in the range of $1.1 \leq L2/L1 \leq 4.2$ although the number of electrode pairs in a surface acoustic wave filter varies with the filter size, operating frequency, and weighting function. For excitation efficiency, a preferable range is $L2/L1 \leq 2.5$, which is suitable for loss reduction.

Figure 2:
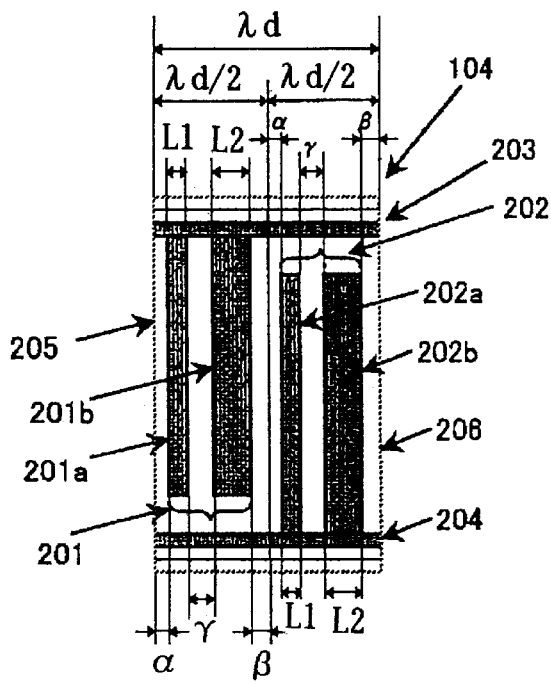
FIG. 2A is an enlarged view of a unidirectional electrode according to the first embodiment of the present invention.
FIG. 2B is a block diagram of a combination of the unidirectional electrode and a bidirectional electrode according to the first embodiment of the present invention.
Figure 2:
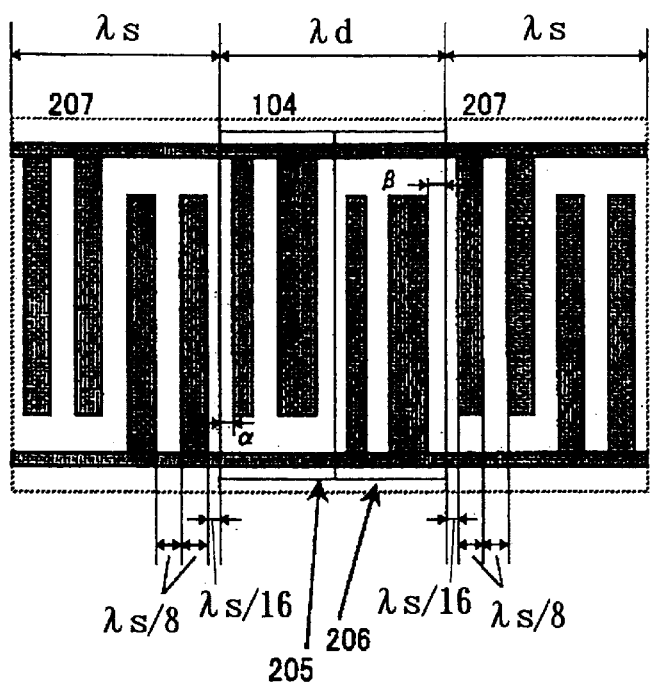

As described with reference to FIG. 2, let $\gamma$ denote the spacing between the narrow electrode finger 201a and wide electrode finger 201b as well as between the narrow electrode finger 202a and wide electrode finger 202b. Besides, assuming $\lambda/2$-wide cells by dividing the basic unidirectional-electrode cell 104, let $\alpha$ denote the spacing between the narrow electrode finger 201a and the left end of $\lambda/2$-wide cell 205 which contains the first electrode finger pair 201 as well as between the narrow electrode finger 202a and the left end of a $\lambda/2$-wide cell 206 which contains the second electrode finger pair 202, and let $\alpha$ denote the spacing between the wide electrode finger 201b and the right end of the $\lambda/2$-wide cell 205 which contains the first electrode finger pair 201 as well as between the wide electrode finger 202b and the right end of the $\lambda/2$-wide cell 206 which contains the second electrode finger pair 202. Then, $\gamma$ is larger than $\alpha+\beta$ and the relationship $\alpha<\beta$ is satisfied. By satisfying $\alpha<\beta$, it is possible to achieve good symmetry, and thus reduce differences within the pass band and increase attenuation outside the pass band.

Regarding the values of $\alpha$ and $\beta$, if $L1+L2=\lambda/4$, for example, on the piezoelectric substrate, then $\alpha$ and $\beta$ have the relationships shown in FIG. 15 when the normalized film thickness, i.e., the ratio of the wavelength to the film thickness, is 1%, 1.4%, and 1.8%.

In FIG. 15, the vertical axis represents $\alpha/(\lambda d/16)$ and $\beta/(\mu d/16)$, which are the values of $\alpha$ and $\beta$ normalized at $\lambda d/16$ while the horizontal axis represents the electrode width ratio (L2/L1). In the figure, the white marks represent the values of $\alpha/(\lambda d/16)$ and the black marks represent the values of $\beta/(\lambda d/16)$ while the circles, squares, and triangles represent the normalized film thicknesses of 1%, 1.5%, and 1.8%, respectively.

Figure 16:
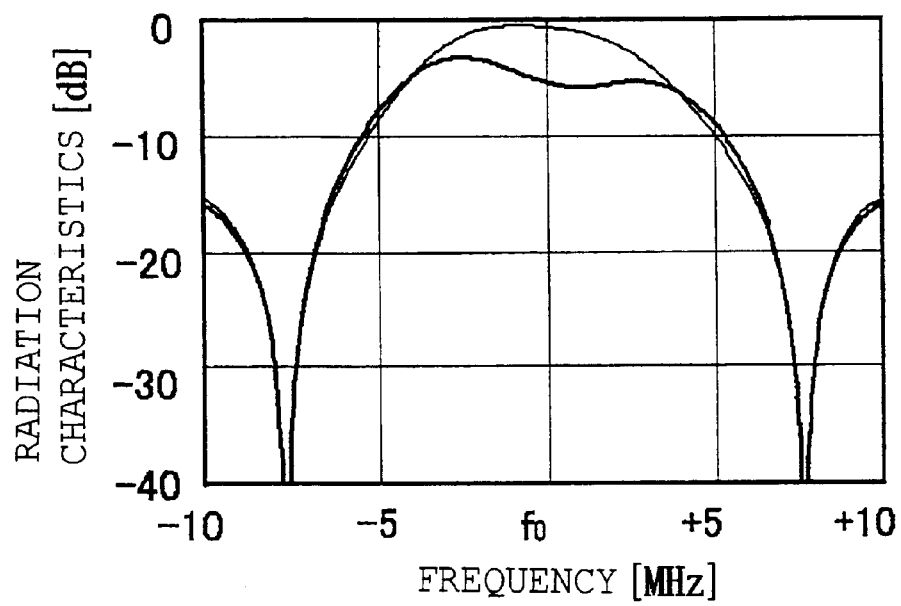
FIG. 16A is a diagram showing radiation characteristics before adjustment of $\alpha$ and $\beta$.
FIG. 16B is a diagram showing radiation characteristics after adjustment of $\alpha$ and $\beta$.
Figure 16:
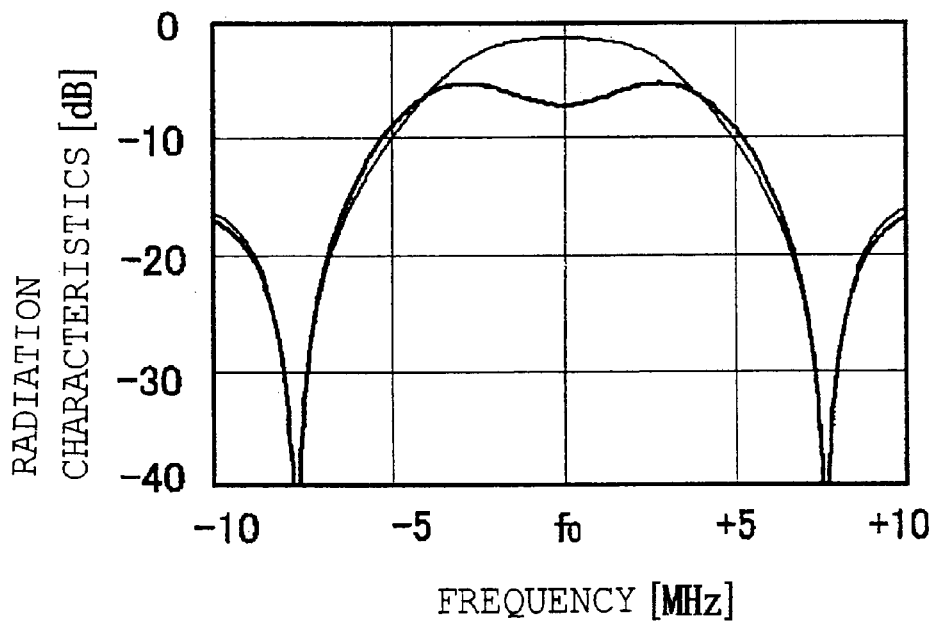

FIG. 16 shows radiation characteristics of the unidirectional electrode according to the present invention. FIG. 16A shows radiation characteristics before adjustment of $\alpha$ and $\beta$ while FIG. 16B shows radiation characteristics after adjustment of $\alpha$ and $\beta$. As can be seen from FIG. 16, it is possible to achieve good symmetry of frequency characteristics by adjusting $\alpha$ and $\beta$ according to FIG. 15.

Thus, by determining $\alpha$ and $\beta$ based on the film thickness ratio and electrode width ratio and providing a phase difference of approximately 45 degrees between the excitation center and reflection center of surface acoustic waves, it is possible to produce intense waves on the right side of the good symmetry in the first basic unidirectional-electrode cell 504. Although this value varies with the electrode fingers which define the excitation center and reflection center, unidirectionality will be produced if the phase difference is $45°+(n-1)\times 90°$ when n is a positive number. Similarly, in the second basic unidirectional-electrode cell 505, intense waves can be produced on the left side of the good symmetry through adjustment of the phase relation between the excitation center and reflection center of surface acoustic waves.

Incidentally, although the values of $\alpha/(\lambda d/16)$ and $\beta/(\lambda d/16)$ change with changes in the normalized film thickness, $\gamma$ is larger than $\alpha+\beta$ and the relationship $\alpha<\beta$ holds regardless of the normalized film thickness.

As described above, the surface acoustic wave filter employing the unidirectional electrode according to the present invention can improve the Q value of the IDT electrodes and thus improve the effective electromechanical coupling factor and reduce losses by making the electrodes which contribute to the excitation of surface acoustic waves act as reflectors instead of providing electrodes which serve solely as reflectors as is the case with the $\lambda/4$-wide electrode fingers of EWC-SPUDT electrodes. Also, by varying the electrode width ratio, it is possible to control directivity.

Figure 17:
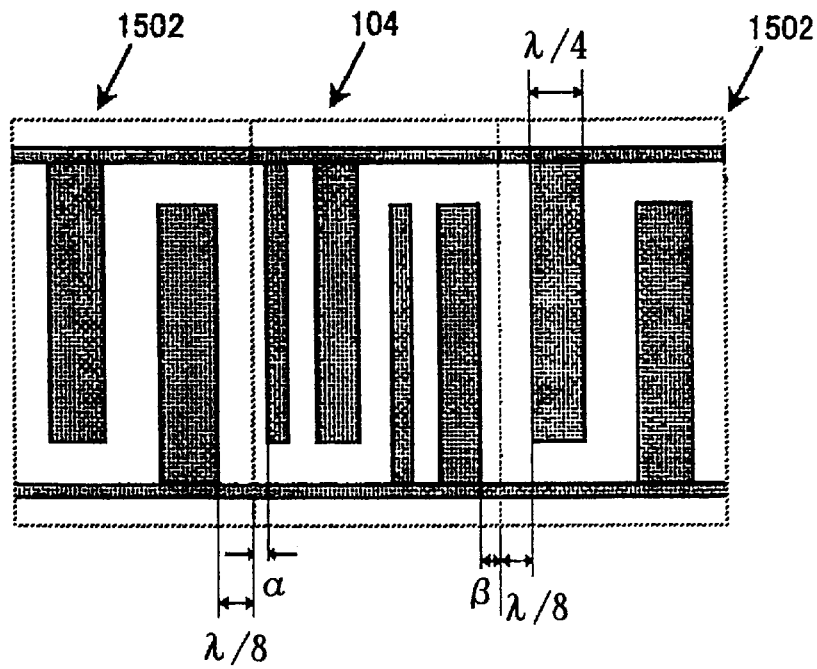
FIG. 17 is a block diagram of $\lambda s/4$-wide bidirectional electrodes and basic unidirectional-electrode cells.

Incidentally, although this embodiment has been described in relation to a configuration which employs the basic unidirectional-electrode cells, insertion loss can be reduced similarly by using a combination of $\lambda s/8$-wide bidirectional electrodes and $\lambda/4$-wide bidirectional electrodes used conventionally. In that case, the basic unidirectional-electrode cell 504 and the $\lambda s/8$-wide bidirectional electrodes should be laid out as shown in FIG. 2B to match the excitation centers of surface acoustic waves between the IDT electrodes. On the other hand, the basic unidirectional-electrode cell 504 and the $\lambda s/4$-wide bidirectional electrodes should be laid out as shown in FIG. 17 to match the excitation centers of surface acoustic waves between the IDT electrodes.

Besides, the combination of bidirectional electrodes is not limited to the above example and is determined by a weighting function to obtain desired filter characteristics.

Besides, although the relationships between $\alpha$ and $\beta$ according to this embodiment have been described in relation to a case in which the relationship $L1+L2=\lambda/4$ holds and the normalized film thickness is 1.0%, 1.4%, and 1.8%, $h/\lambda$ may be other film thickness ratio and L1+L2 may be other than $\lambda d/4$ similar effects can also be obtained under other conditions as long as $\alpha<\beta$ is satisfied.

Besides, although this embodiment has been described in relation to a case in which the unidirectional electrode has one electrode width ratio, it is also possible to use two or more electrode width ratios and install a plurality of basic unidirectional-electrode cells with different directivities in the IDT electrodes. This will increase the degree of freedom of weighting.

Besides, the adjustment of $\alpha$ and $\beta$ shown in FIG. 15 serves not only to adjust the phases of the excitation center and reflection center in the unidirectional electrode of the present invention, but also periodically match the excitation center in the unidirectional electrode of the present invention and the excitation center in the $\lambda s/8$-wide bidirectional electrode or $\lambda/4$-wide bidirectional electrode by maintaining the relationship $\alpha<\beta$ when the IDT electrode also contains the $\lambda/8$-wide bidirectional electrode or $\lambda/4$-wide bidirectional electrode as shown in FIG. 2A and FIG. 17.

Besides, when considering a configuration consisting solely of the unidirectional electrode according to the present invention, it is also possible to establish a relationship $\alpha 0 = \beta 0 = (\alpha+\beta)/2$, where $\alpha 0$ and $\beta 0$ are parameters which represent electrode locations. This is also effective in achieving good symmetry.

Besides, according to this embodiment, the second basic unidirectional-electrode cell 505 has a configuration obtained by reversing the positions of the narrow electrodes and wide electrodes in both first and second electrode finger pairs 201 and 202 of the first basic unidirectional-electrode cell 504. However, even if the first basic unidirectional-electrode cell has a bilaterally symmetrical configuration based on one wavelength, this will only change the phase relation of electrode fingers and will have the same effects on reductions in insertion loss and improvement of filter characteristics.

Besides, although this embodiment has been described in relation to a case in which a 37-degree rot-Y-cut quartz substrate is used, another cut angle may also be used. For example, the use of a 28- to 42-degree rot-Y-cut quartz substrate will produce similar effect. The cut angle is selected according to the electrode film thickness and operating temperature range so that optimum temperature characteristics can be obtained. Also, a piezoelectric substrate of another material such as $LiTaO_3$, $LiNbO_3$, or $Li_2B_4O_7$ will produce similar effect although directivity and the values of L2/L1 and λd/λs may vary.

[Third Embodiment]

The unidirectional electrode used in the first and second embodiments described above may be replaced by the following.

Figure 18:
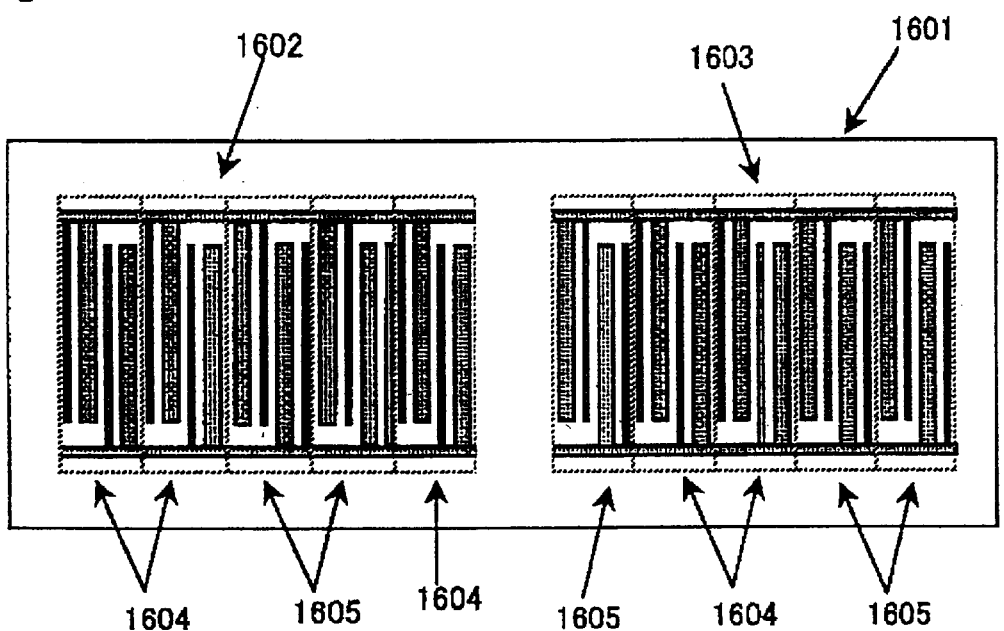
FIG. 18 is a block diagram of a surface acoustic wave filter according to a third embodiment of the present invention.

FIG. 18 shows a surface acoustic wave filter according to a third embodiment of the present invention. In the figure, reference numeral 1601 denotes a piezoelectric substrate. A surface acoustic wave filter is constructed by forming input and output interdigital transducer electrodes 1602 and 1603 (hereinafter referred to as IDT electrodes) on the piezoelectric substrate 1601, disposed at a certain distance from each other. The input IDT electrode 1602 and output IDT electrode 1603 contain unidirectional electrodes. Reference numeral 1604 denotes a first basic unidirectional-electrode cell and reference numeral 1605 denotes a second basic unidirectional-electrode cell. The first and second basic unidirectional-electrode cells 1604 and 1605 are based on one wavelength (1λd). The first basic unidirectional-electrode cell 1604 has a configuration similar to that of the first basic unidirectional-electrode cell 504 shown in FIG. 7 and has such directivity that surface acoustic waves travel from the narrow electrode finger to the wide electrode finger, i.e. rightward directivity. The second basic unidirectional-electrode cell 1605 has a configuration similar to that of the second basic unidirectional-electrode cell 505 shown in FIG. 7 and has such directivity that surface acoustic waves travel from the narrow electrode finger to the wide electrode finger, i.e., leftward directivity.

Figure 19:
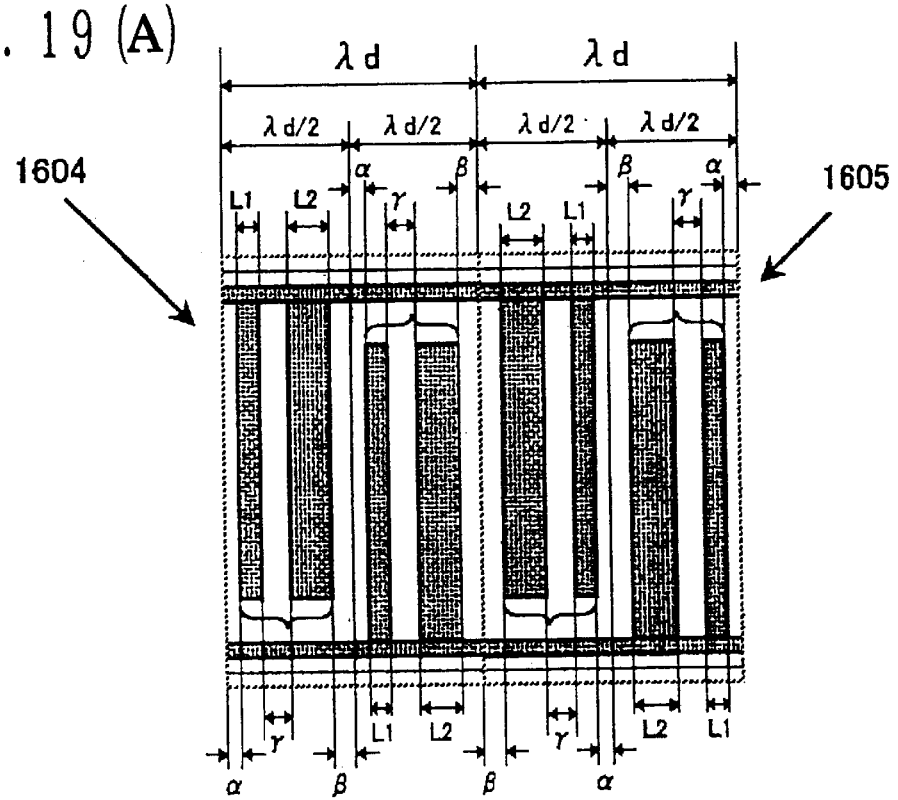
FIGS. 19A and 19B are layout drawings of a first basic unidirectional-electrode cell and second basic unidirectional-electrode cell.
Figure 19:
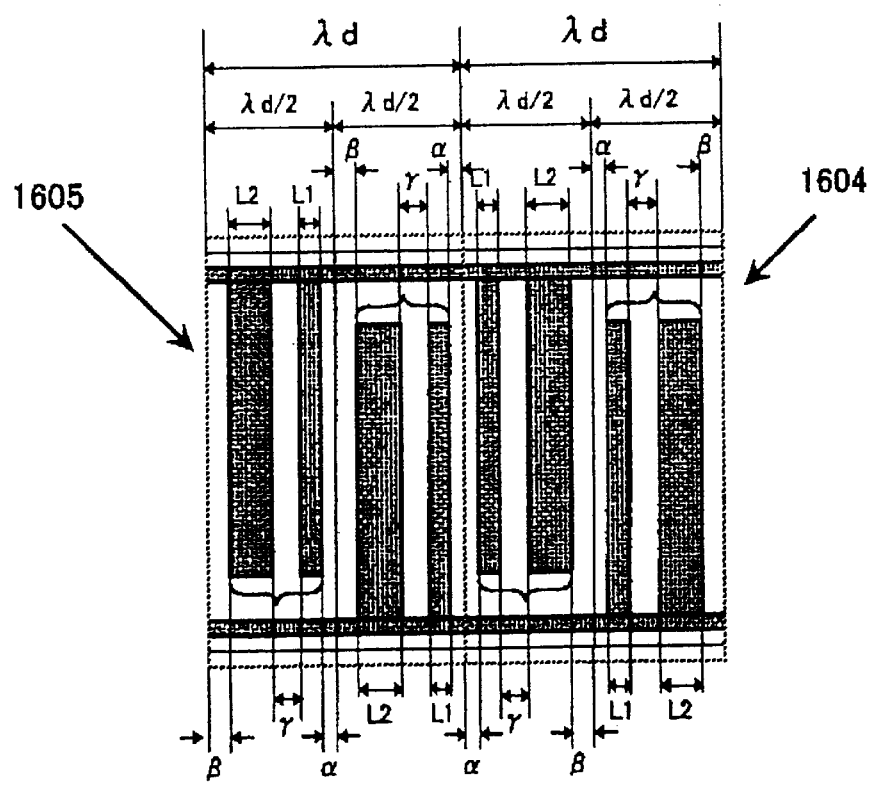

Referring to FIG. 18, in the input IDT electrode 1602, the first basic unidirectional-electrode cell 1604 has forward directivity and the second basic unidirectional-electrode cell 1605 has backward directivity. In the output IDT electrode 1603, the first basic unidirectional-electrode cell 1604 has backward directivity and the second basic unidirectional-electrode cell 1605 has forward directivity. When the first and second basic unidirectional-electrode cells are adjacent to each other they are laid out as shown in FIG. 19.

FIG. 19A is a block diagram of the first basic unidirectional-electrode cell 1604 and second basic unidirectional-electrode cell 1605 arranged in left-to-right order while FIG. 19B is a block diagram of the second basic unidirectional-electrode cell 1605 and first basic unidirectional-electrode cell 1604 arranged in left-to-right order.

With the configuration shown in FIG. 18, if both basic unidirectional-electrode cells with forward directivity and basic unidirectional-electrode cells with backward directivity are provided in the input and output IDT electrodes, the propagation paths of surface acoustic waves can make turns in the input and output IDT electrodes, thus making it possible to reduce size and insertion loss. This technology is known as recursive SPUDT and is generally constructed from unidirectional electrodes such as EWC-SPUDTs.

Through the application of the basic unidirectional-electrode cell of the present invention, this embodiment makes it possible to control directivity by changing the electrode width ratio L2/L1 and reduce insertion loss by keeping the electrode width ratio in the range of $1.1 \leq L2/L1 \leq 4.2$.

Figure 20:
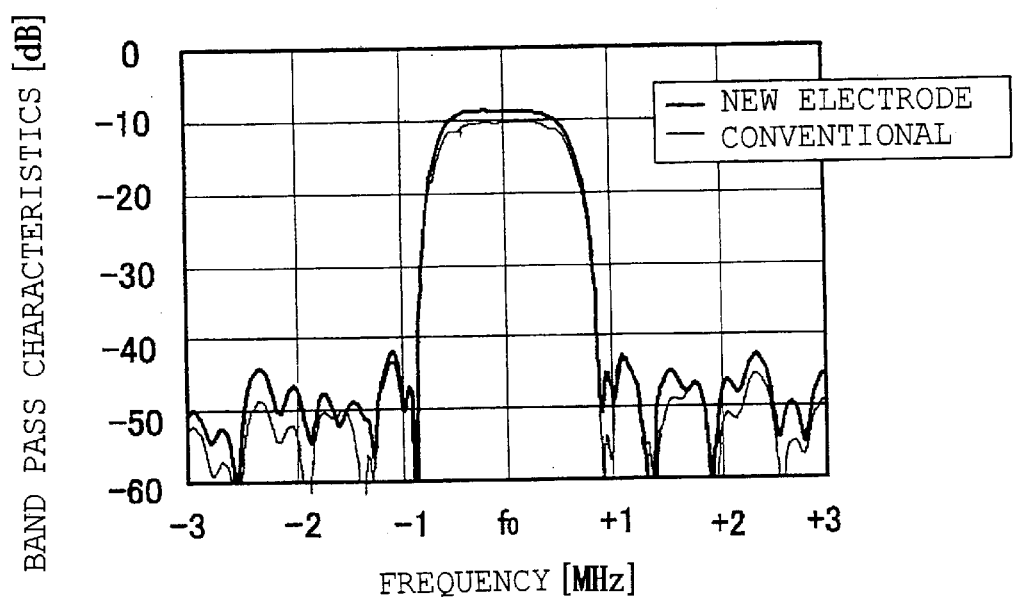
FIGS. 20A and 20B are diagrams showing band pass characteristics of the surface acoustic wave filter according to this embodiment.
Figure 20:
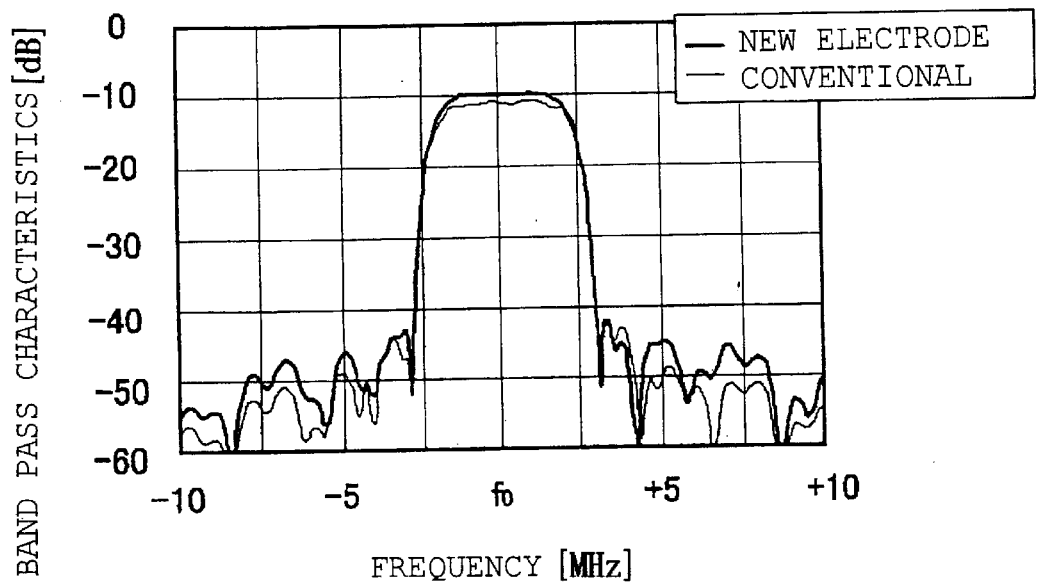

FIG. 20 shows band pass characteristics of surface acoustic wave filters. In the figure, the bold line represents the band pass characteristics of the surface acoustic wave filter according to the present invention while the thin line represents the band pass characteristics of a surface acoustic wave filter with a conventional EWC-SPUDT. Design conditions including bandwidth differ slightly between FIG. 20A and FIG. 20B: FIG. 20A represents filters with h/λ of approximately 1% and a frequency band of 100 MHz while FIG. 20B represents filters with h/λ of approximately 1.5% and a frequency band of 200 MHz.

The filters in FIG. 20A employ a 37-degree rotary-Y-cut quartz substrate and have a normalized film thickness of approximately 1%. Besides, the electrode width ratio according to the present invention is L2/L1=1.8. From FIG. 20A, the surface acoustic wave filter according to the present invention has an insertion loss of 8.7 dB, achieving a reduction of 1.5 dB from 10.2 dB for the conventional surface acoustic wave filter.

The filters in FIG. 20B employ a 37-degree rotary-Y-cut quartz substrate and have a normalized film thickness of approximately 1.5%. Besides, the electrode width ratio according to the present invention is L2/L1=1.8. From FIG. 20B, the surface acoustic wave filter according to the present invention has an insertion loss of 9.8 dB, achieving a reduction of 1.0 dB from 10.8 dB for the conventional surface acoustic wave filter.

Thus, the unidirectional electrode according to the present invention can achieve reductions in insertion loss compared to conventional EWC-SPUDTs even in filters with different normalized film thicknesses, frequencies, and designs.

Figure 21:
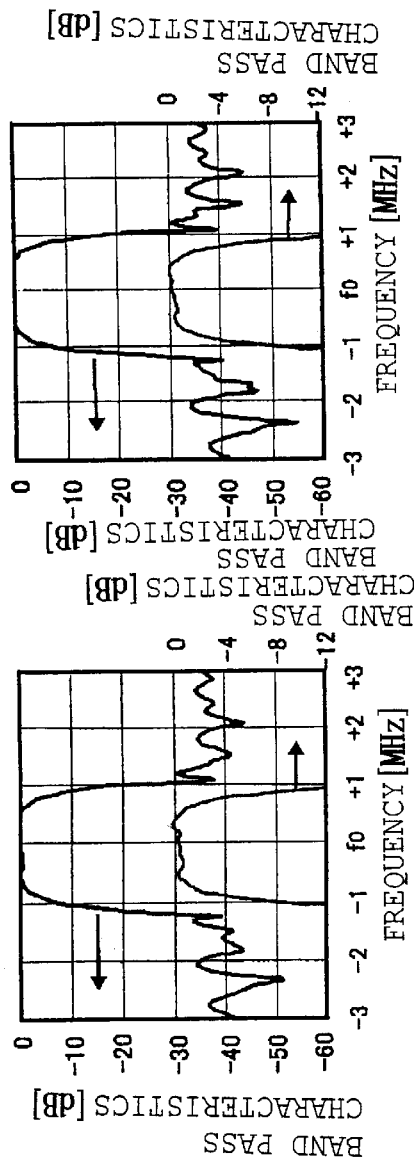
FIG. 21A is a diagram showing band pass characteristics of the surface acoustic wave filter when L2/L1=1.8.
FIG. 21B is a diagram showing band pass characteristics of the surface acoustic wave filter when L2/L1=2.2.
FIG. 21C is a diagram showing band pass characteristics of the surface acoustic wave filter when L2/L1=2.6.
FIG. 21D is a diagram showing band pass characteristics of a surface acoustic wave filter which employs a conventional EWC-SPUDT.
Figure 21:
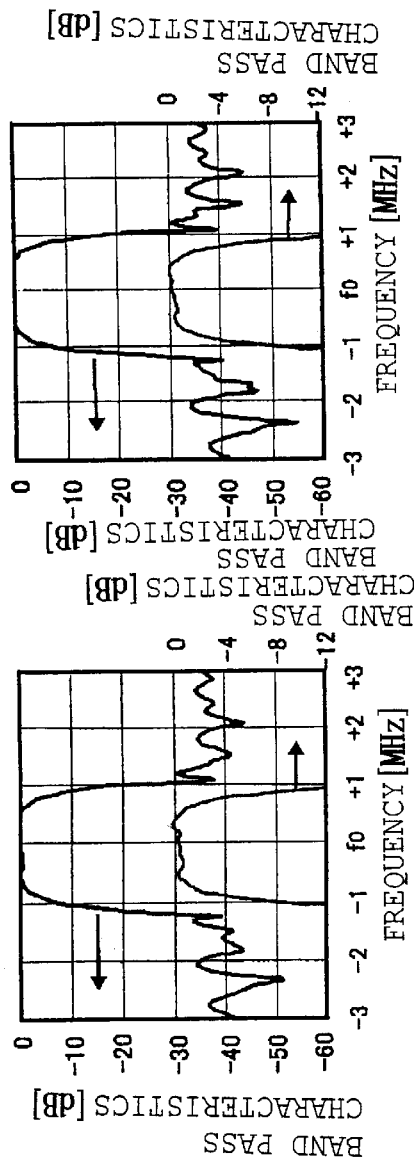
Figure 21:
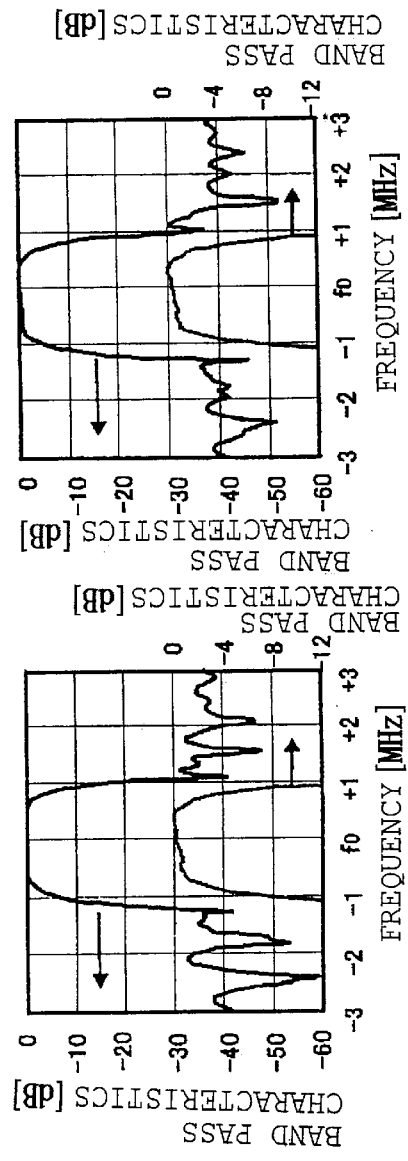
Figure 21:
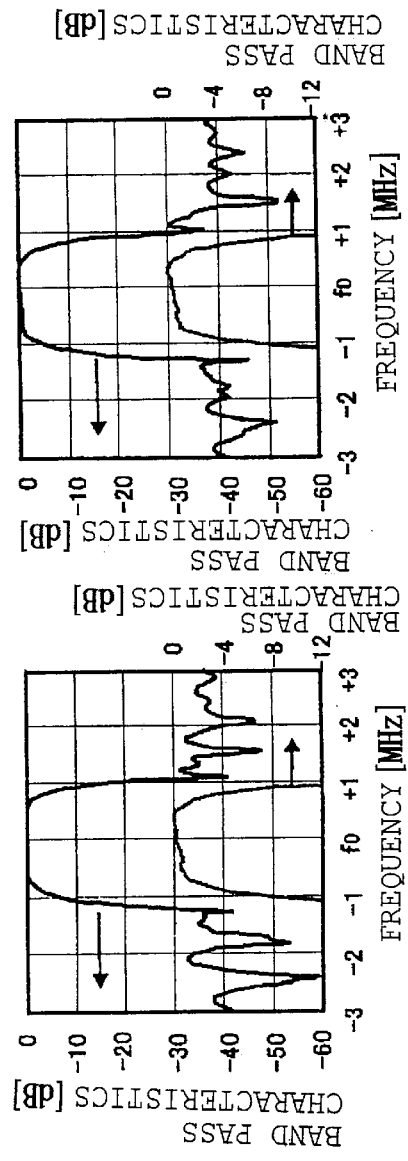

FIG. 21 also shows band pass characteristics of surface acoustic wave filters. The filter in FIG. 21A employs a 37-degree rotary-Y-cut quartz substrate and has a normalized film thickness of approximately 1%. Besides, adjustments have been made using the values of α and β shown in FIG. 15 so that radiation characteristics will have good symmetry. FIG. 21A, FIG. 21B, and FIG. 21C show the band pass characteristics of surface acoustic wave filters with electrode width ratios of L2/L1=1.8, L2/L1=2.2, and L2/L1=2.6, respectively. FIG. 21D shows the band pass characteristics of a surface acoustic wave filter which employs a conventional EWC-SPUDT. The vertical axis of FIG. 21 has been normalized at the minimum insertion loss.

As can be seen from FIG. 21, both ends of the pass band decay increasingly with increases in electrode width ratio until the pass band slopes almost to the same extent as with the EWC-SPUDT at L2/L1=2.6. This is largely due to reflection, i.e., directivity, in the IDT electrodes. As can be seen from the graph for L2/L1=1.8, when the level of directivity is low, the effect of reflection in the IDT electrodes is insignificant and there is no slope in the band pass characteristics of the filter.

Thus, as can be seen from FIG. 13, when the electrode width ratio is $L2/L1 \leq 2.2$, the level of directivity can be lowered than that of the conventional EWC-SPUDT. This makes it possible to reduce the reflection of surface acoustic waves in the basic unidirectional-electrode cells in the IDT electrodes, resulting in reduced insertion loss. Also, as shown in FIG. 18, by satisfying L2/L1≦2.2, it is possible to provide excellent flatness within the pass band because of low reflection in the IDT electrodes.

Thus, a filter with two opposite directivities constructed from the unidirectional electrode of the present invention can achieve low insertion loss. Also, by keeping the electrode width ratio in the range of 1.1≦L2/L1≦2.2 under all the conditions of the number of pairs and normalized film thickness, it is possible to provide a surface acoustic wave filter with excellent in-band flatness.

As described above, surface acoustic wave filters constructed from the unidirectional electrode of the present invention can achieve low insertion loss and in-band flatness.

Incidentally, when constructing the filter of the first embodiment using this embodiment, the relationship λd>λs remains the same as in the first embodiment. This makes it possible to match the frequencies of the unidirectional electrode and bidirectional electrode, and thus achieve good filter characteristics.

Incidentally, although this embodiment has been described in relation to a configuration which employs the basic unidirectional-electrode cells, insertion loss can be reduced similarly by using a combination of λs/8-wide bidirectional electrodes and λ/4-wide bidirectional electrodes used conventionally, as is the case with FIG. 14. Besides, the combination of bidirectional electrodes is not limited to the above example and is determined by a weighting function to obtain desired filter characteristics.

Besides, although the relationships between α and β according to this embodiment have been described in relation to a case in which the relationship L1+L2=λd/4 holds and the normalized film thickness is approximately 1%, 1.5%, and 2%, h/λ may be other film thickness ratio and L1+L2 may be other than λd/4 similar effects can also be obtained under other conditions as long as α<β is satisfied.

Besides, although this embodiment has been described in relation to a case in which the unidirectional electrode has one electrode width ratio, it is also possible to use two or more electrode width ratios and install a plurality of basic unidirectional-electrode cells with different directivities in the IDT electrodes. This will increase the degree of freedom of weighting.

Besides, although this embodiment has been described in relation to a case in which a 37-degree rot-Y-cut quartz substrate is used, another cut angle may also be used. For example, the use of a 28- to 42-degree rot-Y-cut quartz substrate will produce similar effect. The cut angle is selected according to the electrode film thickness and operating temperature range so that optimum temperature characteristics can be obtained. Also, a piezoelectric substrate of another material such as $LiTaO_3$, $LiNbO_3$, or $Li_2B_4O_7$ will produce similar effect. Although directivity and the values of L2/L1 and λd/λs may vary.

Besides, the layout of the first and second basic unidirectional-electrode cells according to this embodiment is not limited to the above example and is determined by a weighting function to obtain desired filter characteristics.

Besides, although both input and output IDT electrodes according to this embodiment contain the unidirectional electrode of the present invention, it is also possible to use a configuration in which only one of the IDT electrodes contains the unidirectional electrode of the present invention.

Besides, the surface acoustic wave filter according to the present invention can lower its input and output impedance below that of surface acoustic wave filters which employ conventional EWC-SPUDTs. This makes it easier to match impedance with devices connected to the preceding or succeeding stages. Thus, it is possible to implement a high performance communications apparatus equipped with the surface acoustic wave filter of the present invention.

As can be seen from the above description, the present invention can provide a low-loss surface acoustic wave filter which excels in in-band flatness and attenuation characteristics.

What is claimed is:

1. A surface acoustic wave filter comprising a piezoelectric substrate and at least two interdigital transducer (IDT) electrodes on said piezoelectric substrate, wherein at least one of said interdigital transducer electrodes includes a unidirectional electrode and bidirectional electrode, and the length λd of a basic cell of said unidirectional electrode is longer than the length λs of a basic cell of said bidirectional electrode.

2. The surface acoustic wave filter according to claim 1 wherein:

said unidirectional electrode has four electrode fingers in the basic cell prescribed by one wavelength and said four electrode fingers form two electrode finger pairs which are interdigitated with each other; and adjacent electrode fingers in each of said two electrode finger pairs have different electrode widths and the electrode width ratio (L2/L1) of the wider electrode finger (L2) to the narrower electrode finger (L1) is larger than 1.

3. The surface acoustic wave filter according to claim 1 wherein said λd/λs is determined such that the frequency of said unidirectional electrode and frequency of said bidirectional electrode will be substantially equal.

4. The surface acoustic wave filter according to claim 3 wherein the film thickness of said unidirectional electrode and film thickness of said bidirectional electrode are substantially equal.

5. The surface acoustic wave filter according to any of claims 1 to 4 wherein said bidirectional electrode has electrode fingers of equal width in the basic cell prescribed by one wavelength.

6. The surface acoustic wave filter according to claim 5 wherein a phase difference substantially equal to ((45+(n−1)×90)) degrees, when n is a positive number, is provided between the excitation center and reflection center of an electrode finger pair having different widths in said unidirectional electrode by making the spacing between the narrower electrode finger and wider electrode finger in the electrode finger pair in said unidirectional electrode larger than the ⅛ wavelength.

7. The surface acoustic wave filter according to claim 5 wherein an electrode finger pair of said unidirectional electrode includes adjacent electrode fingers of different widths and satisfies $$\gamma > \alpha + \beta$$
$$\alpha < \beta \quad \text{(Formula 4)}$$

where:
γ is the distance between the narrower and wider electrode fingers in the electrode finger pair
α is the distance between the narrower electrode finger and the left end of the segment obtained by dividing an IDT electrode into half-wavelengths β is the distance between the wider electrode finger and the right end of the segment obtained by dividing the IDT electrode into half-wavelengths.

8. The surface acoustic wave filter according to claim 7 wherein α and β in the Formula 4 have been adjusted such that radiation characteristics of one of said interdigital transducer electrodes will be bilaterally symmetrical with respect to the center frequency.

9. The surface acoustic wave filter according to claim 1, wherein:

said unidirectional electrode has four electrode fingers in the basic cell prescribed by one wavelength and said four electrode fingers form two electrode finger pairs which are interdigitated with each other;

adjacent electrode fingers in each of said two electrode finger pairs have different electrode widths and the electrode width ratio (L2/L1) of the wider electrode finger (L2) to the narrower electrode finger (L1) is larger than 1; and the electrode width ratio of the electrode finger pairs in said unidirectional electrode is in the range of $1.1 \leq L2/L1 \leq 4.2$.

10. The surface acoustic wave filter according to claim 1, wherein said unidirectional electrode has four electrode fingers in the basic cell prescribed by one wavelength and said four electrode fingers form two electrode finger pairs which are interdigitated with each other:

adjacent electrode fingers in each of said two electrode finger pairs have different electrode widths and the electrode width ratio (L2/L1) of the wider electrode finger (L2) to the narrower electrode finger (L1) is larger than 1; and the electrode width ratio of the electrode finger pairs in said unidirectional electrode is in the range of $1.1 \leq L2/L1 \leq 2.5$.

11. The surface acoustic wave filter according to claim 9 or 10, wherein at least one of the interdigital transducer electrodes contains a first unidirectional electrode for amplifying surface acoustic waves in one direction and a second unidirectional electrode for amplifying surface acoustic waves in the opposite direction.

12. The surface acoustic wave filter according to claim 11, wherein said first unidirectional electrode and said second unidirectional electrode are configured by exchanging the positions of the narrower electrode finger and wider electrode finger or by reversing the cell from left to right.

13. The surface acoustic wave filter according to claim 12, wherein the electrode width ratio (L2/L1) of the electrode finger pairs in said unidirectional electrode is in the range of $1.1 \leq L2/L1 \leq 2.2$.

14. The surface acoustic wave filter according to any of claims 1, 2, 3, 4, 9, or 10, wherein said interdigital transducer electrodes comprise unidirectional electrodes which have multi-directional intensities consisting of two or more electrode width ratios.

15. The surface acoustic wave filter according to any of claims 1, 2, 3, 4, 9, or 10, wherein said piezoelectric substrate is a 28- to 42-degree rot-Y-cut quartz substrate.

16. A communications apparatus containing a surface acoustic wave filter according to any of claims 1, 2, 3, 4, 9, or 10.

* * * * *

UNITED STATES PATENT AND TRADEMARK OFFICE
CERTIFICATE OF CORRECTION

PATENT NO. : 6,710,683 B2
DATED : March 23, 2004
INVENTOR(S) : Hiroyuki Nakamura et al.

It is certified that error appears in the above-identified patent and that said Letters Patent is hereby corrected as shown below:

Title page,
Item [56], References Cited, OTHER PUBLICATIONS,
"H. Nakamura et al.", reference, "A New Design Concept for Low-Loss Saw Filters Based on Different-Width Split-Finger SPUDT," April. 2001, vol. 49, No. 4, pp. 761-768, *IEEE Microwave Theory and Techniques*" should read
-- H. Nakamura et al., "A New Design Concept for Low-Loss SAW Filters Based on Different-Width Split-Finger SPUDT," Apr., 2001, vol. 49, No. 4, pp. 761-768, *IEEE Trans Microwave Theory and Techniques* --
"H. Nakamura et al.", reference, "A Practical SPUDT for Saw Filters with Different-Width Split-Finger Interdigital Transducers," Oct., 2000 pp.105-108, *IEEE Ultrasonics Symposium*" should read --. A Practical SPUDT Design for SAW Filters with Different-Width Split Finger Interdigital Transducers, Oct., 2000, pp. 105-108, *IEEE Ultrasonics Symposium* --
"Hartmann, C.S. et al." reference, "Overview of Desing Challenges for Single Phase Unidirectional Saw Filters (Invited)", 1989 Ultrasonics Symposium, IEEE, pp.79-88 (1989)" should read -- Hartmann, C.S. et al. "Overview of Design Challenges for Single Phase Unidirectional SAW Filters (Invited)", 1989 Ultrasonics Symposium, IEEE, pp. 79-89 (1989) --

Signed and Sealed this

Tenth Day of August, 2004

JON W. DUDAS
*Acting Director of the United States Patent and Trademark Office*